United States Patent
Hayashi et al.

(10) Patent No.: US 6,774,695 B2
(45) Date of Patent: Aug. 10, 2004

(54) LEVEL SHIFT CIRCUIT AND SEMICONDUCTOR INTEGRATED CIRCUIT

(75) Inventors: Hirokatsu Hayashi, Kodaira (JP); Toshiro Takahashi, Hamura (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/976,052

(22) Filed: Oct. 15, 2001

(65) Prior Publication Data

US 2002/0050849 A1 May 2, 2002

(30) Foreign Application Priority Data

Oct. 30, 2000 (JP) ........................................ 2000-330385

(51) Int. Cl.[7] ........................................... H03K 19/185
(52) U.S. Cl. ..................... 327/333; 327/112; 326/63; 326/83
(58) Field of Search ................................ 327/333, 108, 327/112; 326/80, 81–85, 95–98, 62, 63, 68

(56) References Cited

U.S. PATENT DOCUMENTS

| | | | | |
|---|---|---|---|---|
| 5,204,557 A | * | 4/1993 | Nguyen | 326/81 |
| 5,300,835 A | * | 4/1994 | Assar et al. | 326/68 |
| 5,559,996 A | | 9/1996 | Fujioka | 703/23 |
| 5,723,986 A | * | 3/1998 | Nakashiro et al. | 326/81 |
| 5,912,577 A | | 6/1999 | Takagi | 327/333 |
| 6,005,432 A | | 12/1999 | Guo et al. | 327/333 |
| 6,351,173 B1 | * | 2/2002 | Ovens et al. | 327/333 |
| 6,501,306 B1 | * | 12/2002 | Kim et al. | 327/112 |

FOREIGN PATENT DOCUMENTS

| | | |
|---|---|---|
| JP | 5-343979 | 6/1992 |
| JP | 5-343980 | 6/1992 |
| JP | 6-209256 | 1/1993 |

* cited by examiner

*Primary Examiner*—Minh Nguyen
(74) *Attorney, Agent, or Firm*—Reed Smith LLP; Stanley P. Fisher, Esq.; Juan Carlos A. Marquez, Esq.

(57) ABSTRACT

A level conversion circuit is composed of a level shift circuit for supplying a level-converted signal in the same phase as the input signal and a signal in the reverse phase thereto and a follow-up circuit responsive to the earlier of the output signals of the level shift circuit for generating an output signal, wherein the follow-up circuit consists of an inverter circuit in which two p-channel type MOS transistors and two n-channel type MOS transistors are connected in series between a first voltage terminal and a second voltage terminal, of which one pair is used as input transistors and the remaining pair of transistors are subjected to feedback based on the output signal of the level shift circuit to be quickly responsive to the next variation.

17 Claims, 10 Drawing Sheets

LEVEL SHIFT CIRCUIT AND SEMICONDUCTOR INTEGRATED CIRCUIT

BACKGROUND OF THE INVENTION

The present invention relates to a semiconductor integrated circuit and to a level conversion circuit, and more particularly, for instance, to a technology which can be effectively used for an interface circuit for a semiconductor integrated circuit in which the amplitude of internal signals and that of external signals differ from each other.

According to the prior art, circuits for converting signals of a smaller amplitude into signals of a greater amplitude include, for instance, a level conversion circuit disclosed in Japanese Patent Laid-Open No. Hei 5 (1993)-343979, the circuit illustrated in FIG. 10. The circuit of FIG. 10 consists of an inverter INV0, having VDD (e.g. 1.5 V) as its source voltage, for inverting an input signal IN and a latch circuit LT, having VDD2 higher than VDD (e.g. 3.3 V) as its source voltage and the signal/IN resulting from inversion by the inverter and the pre-inversion signal IN. The latch circuit LT has a configuration comprising one CMOS inverter INV1 in which two p-channel MOSFETs Qp1 and Qp2 and one n-channel MOSFET Qn1 are connected in series and one CMOS inverter INV2 in which two p-channel MOSFETs Qp1 and Qp3 and one n-channel MOSFET Qn2 are connected in series, the output terminal of each inverter being connected to the gates of the MOSFETs Qp2 and Qp3 of the other inverter.

SUMMARY OF THE INVENTION

In the level conversion circuit of FIG. 10, when the input signal IN of 0 to 1.5 V in amplitude rises from a low level to a high level, the MOSFET Qn1 immediately shifts from an off-state to an on-state. As a result, its output signal OUT varies from VDD2, which may be 3.3 V for instance, to a ground potential (0 V), but when the input signal IN varies from a high level to a low level, only when the MOSFET Qn2 is turned on by the inverted signal/IN to vary the output of the inverter INV2 to a low level and the MOSFET Qp2 shifts from an off-state to an on-state, the output signal OUT varies from the ground potential (0 V) to VDD2, which may be 3.3 V.

For this reason, a level conversion circuit according to the prior art is slower in the variation of the output signal from a low level to a high level than in the variation from a high level to a low level. As a result, on the part of a circuit to receive a signal from such a level conversion circuit, the signal should be accepted at the later signal timing, resulting in the problems of more complex timing design and of a longer time taken by signal transmission, which impedes raising the system speed.

An object of the present invention is to provide a level conversion circuit whose output signal varies from a low level to a high level and from a high level to a low level substantially as fast.

Another object of the invention is to provide a semiconductor integrated circuit technology which makes it possible to raise the speed of signal transmission in a semiconductor integrated circuit having within it two signal transmission routes differing in amplitude.

Still another object of the invention is to make it possible to raise the speed of a system using a semiconductor integrated circuit having a level conversion circuit in its input/output (I/O) unit and forming and supplying a large amplitude signal on the basis of a narrow amplitude internal signal.

The above-noted and other objects and novel features of the invention will become more apparent from the description in this specification when taken in conjunction with the accompanying drawings.

What follows is a brief summary of typical aspects of the present invention disclosed in this application.

Thus, the configuration is such that a level conversion circuit is composed of a level shift circuit for supplying a level-converted signal in the same phase as the input signal and a signal in the reverse phase thereto and a follow-up circuit responsive to the earlier of the output signals of the level shift circuit for generating an output signal, wherein the follow-up circuit consists of an inverter circuit in which two p-channel type MOS transistors and two n-channel type MOS transistors are connected in series between a first voltage terminal and a second voltage terminal, of which one pair is used as input transistors and the remaining pair of transistors are subjected to control based on the output signal of the level shift circuit to be quickly responsive to the next variation.

A level conversion circuit according to a first aspect of the invention under the present application has a first circuit comprising a first input terminal for receiving a first signal having a first signal amplitude, a first output terminal for supplying a second signal having a second signal amplitude greater than the first signal amplitude and being in the same phase as the first signal, and a second output terminal for supplying a third signal having a second signal amplitude greater than the first signal amplitude and being in the phase reverse to the first signal; and a second circuit comprising a first p-channel type MOS transistor, a second p-channel type MOS transistor, a first n-channel type MOS transistor and a second n-channel type MOS transistor whose source-drain routes are connected in series between a first voltage terminal and a second voltage terminal and the drain of the first p-channel type MOS transistor and the drain of the n-channel type MOS transistor are connected to a third output terminal, wherein the second circuit forms a fourth signal having the second signal amplitude on the basis of the signal variation of the second signal supplied from the first output terminal of the first circuit or of the third signal supplied from the second output terminal of the first circuit, whichever is faster in signal level change, and supplying the fourth signal from the third output terminal.

The above-described means, as the second circuit forms an output signal on the basis of what is faster in signal level change out of the complementary signals supplied from the first circuit, the output signal can quickly vary not only at the leading edge but also the trailing edge of the input signal, and a signal having a small amplitude can be converted into one of a large amplitude and transmitted without sacrificing the signal transmission speed.

Preferably, a delay means may be provided to delay the second signal supplied from the first output terminal of the first circuit or the third signal supplied from the second output terminal of the first circuit to control the second p-channel type MOS transistor and the first n-channel type MOS transistor, or the first p-channel type MOS transistor and the second n-channel type MOS transistor. This results in shifting of the second circuit to a state in which it is more quickly responsive to the next signal change and thereby makes it possible to raise the signal transmission speed.

In a further proposed configuration, where a circuit from which, according to a signal inputted to the gate terminal of a MOS transistor, a signal matching the gate input signal is supplied to the source or drain terminal of the MOS transistor is defined to be one stage, the number of circuit stages which a signal reaching the third output terminal of the second circuit from the first input terminal of the first circuit via the second output terminal goes through and the number of circuit stages which a signal reaching the third output terminal of the second circuit from the first input terminal of the first circuit via the third output terminal goes through are equal. This substantially equalizes the lengths of time taken by the signal in the same phase as the input signal and the signal in the reverse phase to the input signal to reach the second circuit, enabling the output signal to quickly vary not only at the leading edge but also the trailing edge of the input signal and the transmission speed of signals having different amplitudes to be raised.

Further, the second circuit may be so configured that the state of the second p-channel type MOS transistor or the first n-channel type MOS transistor vary with any change in the second signal or the third signal supplied from the first circuit. This makes it possible to reduce the gate size of the second p-channel type MOS transistor or the first n-channel type MOS transistor, thereby alleviating the load on the preceding circuit and accelerate the variations of the second signal and the third signal.

In addition, a high resistance element for pull-up use and a high resistance element for pull-down use may be connected respectively in parallel to the first p-channel type MOS transistor and the second n-channel type MOS transistor. This enables the second circuit to have two logical thresholds, and the variation of the output signal to be further accelerated as the logical threshold drops when the input signal varies from a low level to a high level and rises when the input signal varies from a high to a low level.

The ratio between the gate width and the gate length of the first p-channel type MOS transistor may be set to be greater than the ratio between the gate width and the gate length of the second p-channel type MOS transistor, and the ratio between the gate width and the gate length of the second n-channel type MOS transistor is set to be greater than the ratio between the gate width and the gate length of the first n-channel type MOS transistor. This makes possible reducing the on-resistances of the first p-channel type MOS transistor and the second n-channel type MOS transistor which serve as resistive loads on the second p-channel type MOS transistor and the first n-channel type MOS transistor, contributing to further accelerating the variation of the output signal.

Further, a first inverter for logically inverting the first signal may be provided, and the first circuit may have a second input terminal for receiving the output signal of the first inverter and is configured of a third n-channel type MOS transistor and a fourth n-channel type MOS transistor whose gate terminals are connected respectively to the first input terminal and the second input terminal, a third p-channel type MOS transistor whose source-drain route is connected in series to the third n-channel type MOS transistor and to whose gate terminal is connected the drain terminal of the fourth n-channel type MOS transistor, and a fourth p-channel type MOS transistor whose source-drain route is connected in series to the fourth n-channel type MOS transistor and to whose gate terminal is connected the drain terminal of the third n-channel type MOS transistor, wherein the first output terminal is connected to the drain terminal of the fourth n-channel type MOS transistor, the second output terminal is connected to the drain terminal of the third n-channel type MOS transistor, and a second inverter for logically inverting the second signal is connected to the first output terminal. As this configuration causes the first circuit to receive the first signal and its inverted signal with the n-channel type MOS transistor and operates to vary the second signal and the third signal, which are its outputs, to a low level at high speed, the transmission of the variation of signals from the first circuit to the second circuit is accelerated.

Further, the second circuit may be so configured so that the state of the second p-channel type MOS transistor or the first n-channel type MOS transistor vary with a change in the second signal or the third signal supplied from the first circuit. This configuration makes it possible to reduce the gate size of the second p-channel type MOS transistor or the first n-channel type MOS transistor, thereby alleviating the load on the preceding circuit and accelerate the variations of the second signal and the third signal.

Also, a third inverter may be provided to control the first p-channel type MOS transistor and the second n-channel type MOS transistor according to the second signal supplied from the first output terminal of the first circuit or the output signal of the second inverter, whichever is slower in signal variation. This configuration makes it possible to shift the first p-channel type MOS transistor and the second n-channel type MOS transistor to an on/off state without delay after the fourth signal supplied from the second circuit varies and to prepare for the next signal variation.

Also, a delay means may be provided to control the second p-channel type MOS transistor and the first n-channel type MOS transistor or the first p-channel type MOS transistor and the second n-channel type MOS transistor according to the signal variation of the second signal supplied from the first output terminal of the first circuit or of the third signal supplied from the second output terminal of the first circuit, whichever is slower in signal variation. This configuration makes it possible to shift the first p-channel type MOS transistor and the second n-channel type MOS transistor or the first p-channel type MOS transistor and the second n-channel type MOS transistor to an on/off state without delay after the fourth signal supplied from the second circuit varies and to prepare for the next signal variation.

Further, the second circuit may as well be so configured as to cause the state of the first p-channel type MOS transistor or the second n-channel type MOS transistor in response to a variation of the second signal or the third signal supplied from the first circuit, whichever is faster. This results in a variation of the thresholds of the first p-channel type MOS transistor and the second n-channel type MOS transistor by the substrate bias effect, making it possible to avoid a slowdown in output signal variation.

A level conversion circuit according to a second aspect of the invention under the present application has a first circuit comprising a first input terminal for receiving a first signal having a first signal amplitude, a first output terminal for supplying a second signal having a second signal amplitude greater than the first signal amplitude and being in the same phase as the first signal, and a second output terminal for supplying a third signal having a second signal amplitude greater than the first signal amplitude and being in the phase reverse to the first signal; and a second circuit for forming a fourth signal having the second signal amplitude on the basis of a variation of the second signal supplied from the first output terminal of the first circuit or of the third signal supplied from the second output terminal of the first circuit, whichever is faster in signal level change, and supplying the fourth signal from the third output terminal, wherein the second circuit receives the second signal or the third signal supplied from the first circuit and a signal in the reverse phase thereto, and the logical threshold is varied so as to accelerate the variation of the fourth signal according to the direction of signal variation.

As the above-described means causes the logical threshold to vary so as to accelerate the variation of the fourth signal according to the direction of signal variation, the output signal is enabled to quickly vary not only at the leading edge but also the trailing edge of the input signal, so that a signal having a small amplitude can be converted into one of a large amplitude and transmitted without sacrificing the signal transmission speed.

Preferably, the second circuit may have a first p-channel type MOS transistor, a second p-channel type MOS transistor, a first n-channel type MOS transistor and a second n-channel type MOS transistor whose source-drain routes are connected in series between the first voltage terminal and the second voltage terminal, wherein the drain of the first p-channel type MOS transistor and the drain of the n-channel type MOS transistor are connected to the third output terminal, high resistance elements may be connected respectively in parallel to the second p-channel type MOS transistor and the first n-channel type MOS transistor, and a delay means is provided to delay the second signal supplied from the first output terminal of the first circuit or the third signal supplied from the second output terminal of the first circuit to control the second p-channel type MOS transistor and the first n-channel type MOS transistor or the first p-channel type MOS transistor and the second n-channel type MOS transistor.

This configuration makes it possible to reduce the gate size of the second p-channel type MOS transistor or the first n-channel type MOS transistor, thereby alleviating the load on the preceding circuit and accelerate the variations of the second signal and the third signal. At the same time, it makes possible shifting of the first p-channel type MOS transistor and the second n-channel type MOS transistor to an on/off state without delay after the fourth signal supplied from the second circuit varies and preparing for the next signal variation.

A level conversion circuit according to a third aspect of the invention under the present application has a first circuit comprising a first input terminal for receiving a first signal having a first signal amplitude, a first output terminal for supplying a second signal having a second signal amplitude greater than the first signal amplitude and being in the same phase as the first signal, and a second output terminal for supplying a third signal having a second signal amplitude greater than the first signal amplitude and being in the phase reverse to the first signal; and a second circuit for forming a fourth signal having the second signal amplitude on the basis of a variation of the second signal supplied from the first output terminal of the first circuit or of the third signal supplied from the second output terminal of the first circuit, whichever is faster in signal level change, and supplying the fourth signal from the third output terminal, wherein, a circuit from which, according to a signal inputted to the gate terminal of a MOS transistor, a signal matching the gate input signal is supplied from the source or drain terminal of the MOS transistor being defined to be one stage, the number of circuit stages which a signal reaching the third output terminal of the second circuit from the first input terminal of the first circuit via the second output terminal goes through and the number of circuit stages which a signal reaching the third output terminal of the second circuit from the first input terminal of the first circuit via the third output terminal goes through are not more than four each.

As in the above-described means the second circuit forms an output signal on the basis of what is faster in signal level change out of the complementary signals supplied from the first circuit and supplies it, the output signal can quickly vary not only at the leading edge but also the trailing edge of the input signal, and a signal having a small amplitude can be converted into one of a large amplitude and transmitted without sacrificing the signal transmission speed. Moreover, as the number of circuit stages which a signal reaching the third output terminal of the second circuit from the first input terminal of the first circuit via the second output terminal goes through and the number of circuit stages which a signal reaching the third output terminal of the second circuit from the first input terminal of the first circuit via the third output terminal goes through are not more than four each, signal transmission is accomplished at higher speed.

A level conversion circuit according to a fourth aspect of the invention under the present application has a first circuit comprising a first input terminal for receiving a first signal having a first signal amplitude, a first output terminal for supplying a second signal having a second signal amplitude greater than the first signal amplitude and being in the same phase as the first signal, and a second output terminal for supplying a third signal having a second signal amplitude greater than the first signal amplitude and being in the phase reverse to the first signal; and a second circuit for forming a fourth signal having the second signal amplitude on the basis of a variation of the second signal supplied from the first output terminal of the first circuit or of the third signal supplied from the second output terminal of the first circuit, whichever is faster in signal level change, and supplying the fourth signal from the third output terminal, wherein, a circuit from which, according to a signal inputted to the gate terminal of a MOS transistor, a signal matching the gate input signal is supplied from the source or drain terminal of the MOS transistor being defined to be one stage, the number of circuit stages which a signal reaching the third output terminal of the second circuit from the first input terminal of the first circuit via the second output terminal goes through and the number of circuit stages which a signal reaching the third output terminal of the second circuit from the first input terminal of the first circuit via the third output terminal goes through are three each.

As in the above-described means the second circuit forms an output signal on the basis of what is faster in signal level change out of the complementary signals supplied from the first circuit and supplies it, the output signal can quickly vary not only at the leading edge but also the trailing edge of the input signal, and a signal having a small amplitude can be converted into one of a large amplitude and transmitted without sacrificing the signal transmission speed. Moreover, as the number of circuit stages which a signal reaching the third output terminal of the second circuit from the first input terminal of the first circuit via the second output terminal goes through and the number of circuit stages which a signal reaching the third output terminal of the second circuit from the first input terminal of the first circuit via the third output terminal goes through are three each, signal transmission is accomplished at even higher speed.

According to a fifth aspect of the invention under the present application, there is provided a semiconductor integrated circuit wherein signals are transmitted in a first amplitude in internal circuits and signals are transmitted and received to and from other external devices in a second amplitude greater than the first amplitude, and a level conversion circuit having any of the above-described configurations is provided in an input/output (I/O) circuit connected to an external terminal at which signals of the second amplitude are supplied. This makes it possible to increase the operating speed of a system using a semiconductor integrated circuit which operates internally at high speed with signals of a smaller amplitude and transmits and receives data to and from other devices with signals of a larger amplitude.

Preferably, an inverse level conversion circuit for converting signals of the second amplitude into signals of the first amplitude may be provided in the I/O circuit connected to the external terminal to which the signals of the second amplitude are inputted. This enables signals of the larger amplitude supplied from other devices to be converted into signals of the smaller amplitude suitable for internal circuits and to be supplied as such to the internal circuits.

According to a sixth aspect of the invention under the present application, there are provided a first level conversion circuit provided with a first circuit comprising a first input terminal for receiving a first signal having a first signal amplitude, a first output terminal for supplying a second signal having a second signal amplitude greater than the first signal amplitude and being in the same phase as the first signal, and a second output terminal for supplying a third signal having a second signal amplitude greater than the first signal amplitude and being in the phase reverse to the first signal; and a second circuit for forming a fourth signal having the second signal amplitude on the basis of a variation of the second signal supplied from the first output terminal of the first circuit or of the third signal supplied from the second output terminal of the first circuit, whichever is faster in signal level change, and supplying the fourth signal from the third output terminal; and a second level conversion circuit consisting of a circuit of the same form as the first circuit. As the second level conversion circuit consists of a smaller number of constituent elements than the first level conversion circuit, both higher speed and smaller occupied space can be achieved at the same speed by selectively using the first level conversion circuit and the second level conversion circuit according to the required signal transmission speed.

Preferably, the first level conversion circuit may be provided on the path of transmitting usual operational signals and the second level conversion circuit, on the path of transmitting testing signals. Since testing signals do not require particularly high transmission speed, arrangement of the second level conversion circuit on the path of transmitting testing signal would contribute to reducing the space occupied.

DESCRIPTION OF THE PREFERRED EMBODIMENTS

Preferred embodiments of the present invention will be described below with reference to the accompanying drawings.

Figures 1, 2:
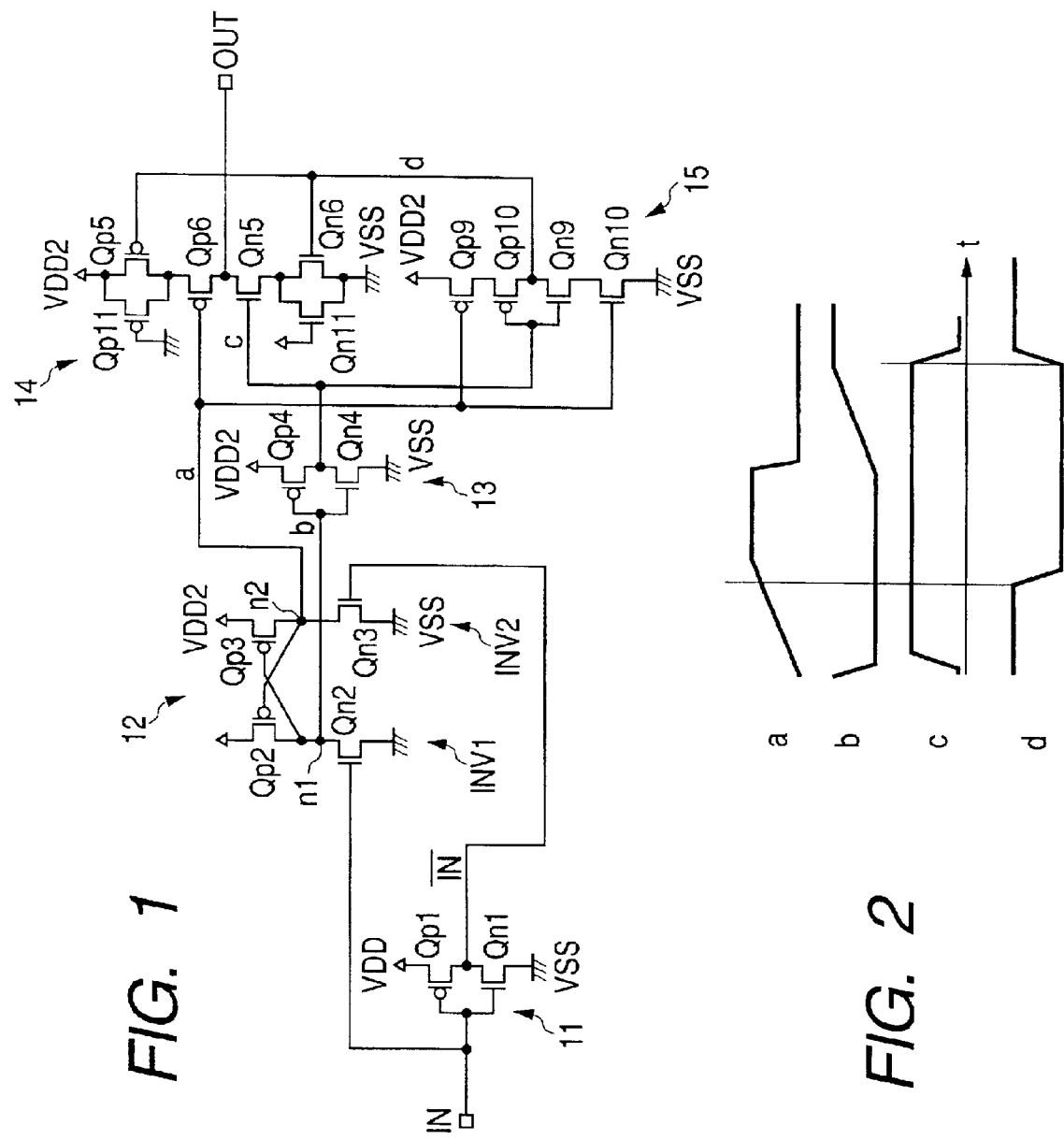
FIG. 1 is a circuit diagram of a voltage boost type level conversion circuit, which is a first preferred embodiment of the present invention.
FIG. 2 is a timing chart showing the signal timing in the level conversion circuit of FIG. 1.

FIG. 1 is a circuit diagram of a level conversion circuit, which is a first preferred embodiment of the invention. In FIG. 1, a sign used for denoting MOSFETs denotes a p-channel MOSFET if its gate terminal position is marked with a small circle or, if not, an n-channel MOSFET.

The level conversion circuit of FIG. 1 is configured of a first stage inverter 11 for inverting an input signal IN, a latch circuit type level shift stage 12 whose inputs are a signal/IN inverted by the inverter 11 and the pre-inversion signal IN, another inverter 13 for inverting a signal on the inverted output node n1 side of the level shift stage 12, an inverter type output stage 14 whose inputs are the output signal of the inverter 13 and a signal on the non-inverted output node n2 side of the level shift stage 12, and a delay stage 15 for controlling the output stage 14 by delaying the input signals to the output stage 14.

The inverter 11 has a source voltage VDD (e.g. 1.5 V), and the level shift stage 12 has a source voltage VDD2 (e.g. 3.3 V) higher than VDD. The source voltages of the inverter 13, the output stage 14 and the delay stage 15 following the level shift stage 12 are also VDD2 (e.g. 3.3 V), equal to that of the level shift stage 12.

The level shift stage 12 consists of a P-MOS load type inverter INV1 in which a p-channel MOSFET Qp2 and an n-channel MOSFET Qn2 are connected in series and a P-MOS load type inverter INV2 in which a p-channel MOSFET Qp3 and an n-channel MOSFET Qn3 are connected in series, the output nodes n1 and n2 of each of the inverters INV1 and INV2 are connected to the gate terminals of the p-channel MOSFETs Qp3 and Qp2 of the other inverter, and the input signal IN and the signal/IN resulting from its inversion by the inverter 11 are applied to the gate terminals of the n-channel MOSFETs Qn2 and Qn3.

In this embodiment, the MOSFETs Qp2, Qn2, Qp3 and Qn3 constituting the level shift stage 12 are so designed that the ratio Wp2:Wn2 between the gate width Wp2 of the p-channel MOSFETs Qp2 and Qp3 and the gate width Wn2 of the n-channel MOSFETs Qn2 and Qn3 and the ratio Wp3:Wn3 be 1:15 each, i.e. Wn2 and Wn3 be greater than Wp2 and Wp3, respectively. This makes the trailing edges of the potentials of the output nodes n1 and n2 of the level shift stage 12 faster than their leading edges.

To add, as the MOSFETs Qp2, Qn2, Qp3 and Qn3 are equal to each other in gate length in this embodiment, the relationship in element characteristic between the gate width Wp2 of the p-channel MOSFETs Qp2 and Qp3 and the gate width Wn2 of the n-channel MOSFETs Qn2 and Qn3 are represented by the ratios Wp2:Wn2 and Wp3:Wn3, the element characteristic is in principle represented by the ratio W/L between the gate width W and the gate length L. Therefore, the setting may as well be to make the W/L ratio between Qp2 and Qp3 on the one hand and Qn2 and Qn3 on the other be 1:15. As the gate lengths are equal, the following description will continue to refer to the ratio in the gate width W, but the relationship may as well be represented by the W/L ratio.

Incidentally, the reason why the W/L ratio between p-MOS and n-MOS of the level shift stage 12 in this embodiment is 1:15 with an extremely heavy weight on n-MOS is to secure a sufficient D.C. operation margin for the level shift stage 12. Thus, in a practical circuit design, it is essential to allow for an operation margin so that the circuit can stably operate even when the source voltage fluctuates. With a view to such stability of circuit operation, the W/L ratio between p-MOS and n-MOS is set to 1:15 even under the condition of a much higher source voltage VDD2 than VDD in the level shift stage 12 of FIG. 1.

To describe it more specifically, under a condition where the source voltage VDD2 for driving p-MOS is high and the source voltage VDD for driving n-MOS is low, the on-resistance of p-MOS is small and, conversely, the on-resistance of n-MOS is large. Supposing that the on-resistances of p-MOS and n-MOS have become substantially equal, the on-resistance will drop no farther than ½ of the output VDD2 of the level shift stage 12. This would be insufficient to turn off the n-MOS of the circuit of the next stage. Therefore, the on-resistance of n-MOS << the on-resistance of p-MOS becomes the indispensable requirement of D.C. operation. If this requirement is not satisfied, in the worse case the output of the circuit will not be inverted, or the delay time will become extremely too long.

Although the W/L ratio is designed to be 1:15 for this embodiment with VDD=1.5 V and VDD2=3.3 V being assumed, VDD is expected to be lower than 1.5 V in the next generation process. However, as VDD2=3.3 V presupposes connection to standard interfaces such as LV-TTL and PCI used in common systems, VDD2 seems unlikely to be changed even if the process advances. Therefore, the difference between VDD2 and VDD is likely to widen in the future, but the invention will remain effective even if this expectation proves true.

The inverter 13 for inverting signals on the inverted output node n1 side of the level shift stage 12 is configured of the p-channel MOSFET Qp4 and the n-channel MOSFET Qn4, and is so designed that the ratio Wp4:Wn4 between the gate width Wp4 of the p-channel MOSFET Qp4 and the gate width Wn4 of the n-channel MOSFET Qn4 to be heavily inclined to Wp4 over Wn4, such as 8:1. Thus the inverter 13 is so configured that the output be faster at the leading edge than at the trailing edge.

The output stage 14 is configured by the connection in series of the source-drain routes of two p-channel MOSFETs Qp5 and Qp6 and two n-channel MOSFETs Qn5 and Qn6, and signals on the non-inverted output node n2 side of the level shift stage 12 and signals resulting from inversion of signals by the inverter 13 on the inverted output node n1 side are applied to the gate terminals of Qp6 and Qn5. Thus, signals inputted to the gate terminals of the MOSFETs Qp6 and Qn5 are in the same phase, resulting on/off control of the MOSFETs Qp6 and Qn5 in a complementary way. The output terminal OUT of the circuit is connected to the output node n4 of this output stage 14.

The output signal of the delay stage 15 is applied to the gate terminals of the MOSFETs Qp5 and Qn6, and Qp5 is turned on or off with a little delay from the turning off or on of Qp6. Thus when Qp6 is turned on, Qp5 is off, while Qp5 is turned on when Qp6 is off. Qn6 is turned on with a little delay from the turning off of Qn5. The MOSFETs Qp11 and Qn11 are connected in parallel to the MOSFETs Qp5 and Qn6, respectively, and Qp11 and Qn11, whose gate terminals are connected respectively to the source voltage VDD2 and the ground potential VSS and kept on all the time, and function as high resistance elements having higher resistances than Qp5 and Qn6.

The gate width Wp6 of the p-channel MOSFET Qp6 constituting the output stage 14 is so designed, though not necessarily so limited, that its ratio to the gate width Wp2 of the p-channel MOSFETs Qp2 and Qp3 of the level shift stage 12, i.e. Wp6:Wp2, be about 10:1. On the other hand, the ratio of the gate width Wn5 of the n-channel MOSFET Qn5 constituting the output stage 14 to the gate width Wn2 of the n-channel MOSFETs Qn2 and Qn3 constituting the level shift stage 12, i.e. Wn5:Wn2, is designed to be about 1:3.

The ratio between the gate width Wp11 of the MOSFET Qp11 for high resistance use and the gate width Wp5 of Qp5, i.e. Wp11:Wp5, is designed to be about 1:10, and that between the gate width Wn11 of the MOSFET Qn11 for high resistance use and the gate width Wn5 of Qn6, i.e. Wn11:Wn6, is also designed to be about 1:10. Further, the ratio between the gate width Wp5 of the MOSFET Qp5 in parallel to Qp11 and the gate width Wp6 of Qp6 in series to the same, i.e. Wp5:Wp6, is designed to be about 2:1, and the gate width Wn6 of the MOSFET Qn6 in parallel to Qn11 and the gate width Wn5 of Qn5 in series to the same, i.e. Wn6:Wn5, is designed to be about 2:1.

The delay stage 15 consists of two p-channel MOSFETs Qp9 and Qp10 and two n-channel MOSFETs Qn9 and Qn10 whose source-drain routes are connected in series; the same signal as that inputted to the gate terminal of the MOSFET Qn5 of the output stage 14 is inputted to the gate terminals of Qp10 and Qn9, and the same signal as that inputted to the gate terminal of the MOSFET Qp6 of the output stage 14 is inputted to the gate terminals of Qp9 and Qn10, of which the slower signal is inverted to control the gate terminals of the MOSFETs Qp5 and Qn6 of the output stage 14.

This subjects the p-channel MOSFET Qp5 and the n-channel MOSFET Qn6 constituting the output stage 14 to on/off control in a complementary manner. Further, when the input signal to the output stage 14 varies to a high level to turn on the MOSFET Qn5 and the output varies from a high level to a low level, the p-channel MOSFET Qp5 is turned on and the n-channel MOSFET Qn6 is turned off with a little delay; the output terminal OUT is fixed to the ground potential via Qn5 and Qn11. On the other hand, when the input signal to the output stage 14 varies to a low level to turn on the MOSFET Qp6 and the output varies from a high level to a low level, the p-channel MOSFET Qp5 is turned off and the n-channel MOSFET Qn6 is turned on with a little delay; the output terminal OUT is fixed to the source voltage VDD2 via Qp6 and Qp11.

In the level conversion circuit embodying the invention as described above, once the potential of the output terminal OUT is made definite according to the turning on/off of the MOSFETs Qp6 and Qn5 of the output stage 14, the delay stage 15 promptly shifts the MOSFETs Qp5 and Qn6 of the output stage 14 to an on/off state reverse to Qp6 and Qn5, and accordingly the output stage 14 can be placed in a state immediately responsible to the next input signal variation.

To add, in the embodiment shown in FIG. 1, as the output d of the delay stage 15 varies according to signals a or c inputted to the gate terminals of the MOSFETs Qp6 and Qn5 of the output stage 14, whichever is slower to vary, to control the gate terminals of the MOSFETs Qp5 and Qn6 of the output stage 14 as shown in FIG. 2, it is configured of the four MOSFETs Qp9, Qp10, Qn9 and Qn10 in a series form. However, if the signal inputted to the gate terminal of either the MOSFET Qp6 or Qn5 of the output stage 14, for example Qn5, is slower to vary to a low level or the timing difference of the variation to a low level is insignificant, either Qp9 or Qp10 can be dispensed with to reduce the layout area. Similarly, depending on the timing, either Qn9 or Qn10 can be dispensed with.

Next will be described the operation of the level conversion circuit embodying the invention as illustrated in FIG. 1.

First will be considered a case in which the input signal IN varies from a low level to a high level. As the input signal is at a low level in the preceding state, the n-channel MOSFET Qn5 of the output stage 14 is in an off state and the p-channel MOSFET Qp6 is in an on state; the output of the delay stage 15 is at a high level to turn on the n-channel MOSFET Qn6 of the output stage 14 and to turn off the p-channel MOSFET Qp5. As a result, the output stage 14 is in a state of giving a high level output via the p-channel MOSFETs Qp11 and Qp6 in an on state.

When the input signal IN varies from a low level to a high level in this state, because the n-channel MOSFET Qn2 has a greater gate width than the p-channel MOSFET Qp2 in the level shift stage 12, the output node n1 promptly changes from a high level to a low level. This change in potential is transmitted to the gate terminal of the MOSFET Qn5 of the output stage 14 via the inverter 13 at a somewhat delayed timing, and shifts Qn5 from an off state to an on state. However, as the p-channel MOSFET Qp4 has a greater gate width than the n-channel MOSFET Qn4 in the inverter 13, the logical threshold is close to VDD2 and the variation from a low level to a high level takes place promptly, the delay time then in the inverter 13 is considerably short. As a result, the output promptly varies from a high level to a low level.

On the other hand, the n-channel MOSFET Qn3 of the level shift stage 12 is turned off by the output signal of the inverter 11 for inverting the input signal IN a little later than the turning-on of Qn2. Then the shifting of the p-channel MOSFET Qp3 from an off state to an on state is begun relatively promptly by the potential variation of the output node n1 to a low level. However, as the p-channel MOSFET Qp3 is narrower in gate width than the n-channel MOSFET Qn3, the variation of the output node n2 from a low level to a high level is a little slower than that of the output node n1 from a high level to a low level. This potential variation is immediately transmitted to the gate terminal of the MOSFET Qp6 of the output stage 14 to shift Qp6 from an on state to an off state.

As described above, the signal transmitting the positive phase side of the level shift stage 12 is transmitted to n-MOS of the output stage 14 via the level shift stage 12 and the inverter 13, and the signal transmitting the negative phase side of the level shift stage 12 is transmitted to p-MOS of the output stage 14 via the inverter 11 and the level shift stage 12. Since a delay equivalent to two inverter stages is thus given to each, the signals on the two sides arrive at substantially the same time. In other words, though it is possible as a matter of logical operation to arrange the inverter 13 on the negative phase side, instead of the positive phase side, of the level shift stage 12, but if it is so arranged, the signal transmitting the positive phase side of the level shift stage 12 will be delayed by an equivalent of three inverter stages, while the signal transmitting the negative phase side of the level shift stage 12 will be delayed by an equivalent of only one inverter stage, resulting an imbalance in delay time. If the p-MOS side and the n-MOS side of the output stage 14 had substantially the same load drive forces, the operating speed of the circuit would be regulated by the slower signal, but it is not the case with this embodiment.

Figure 10:
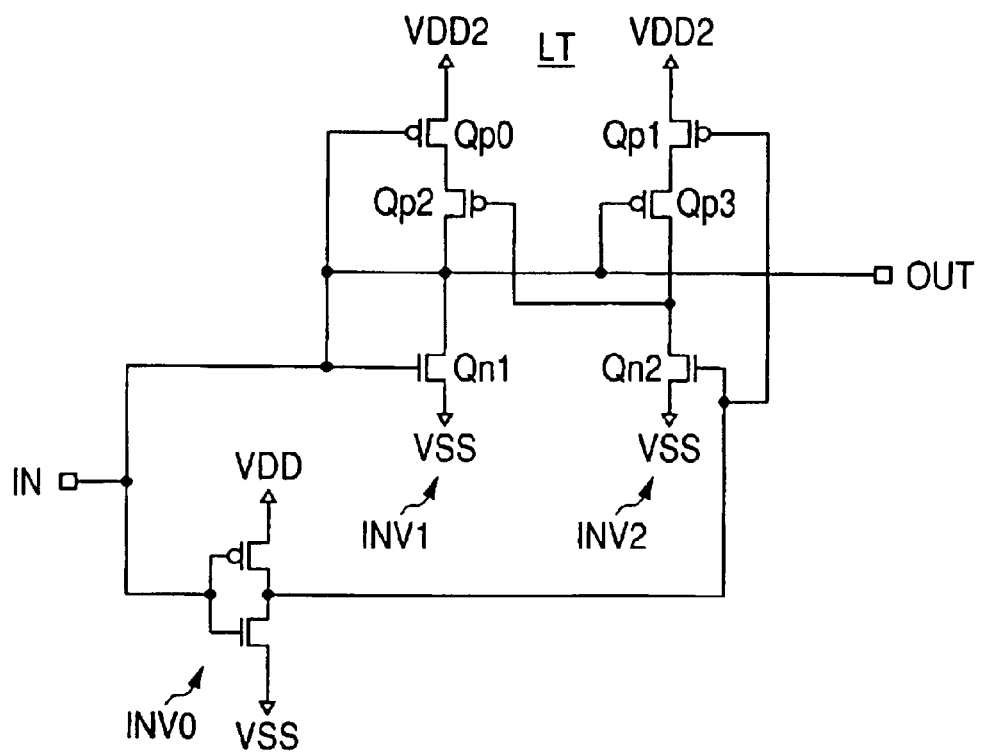
FIG. 10 is a circuit diagram of a voltage boost type level conversion circuit, which is an embodiment of the prior art.

Furthermore, as the level conversion circuit embodying the invention in this way is so designed that the gate width ratio Wp2:Wn2 between the n-channel MOSFET Qn2 and the p-channel MOSFET Qp2 be 1:15, i.e. Wn2 be greater than Wp2, the signal variation at the node n1 from a high level to a low level is faster then in the conventional level conversion circuit shown in FIG. 10. Therefore, in spite of the presence of the inverter 13, the fall of the output to a low level takes place at comparable speed to the conventional level conversion circuit. Moreover, as the logical threshold of the inverter 13 is set high, the delay time in the inverter 13 is extremely short.

Figure 3B:
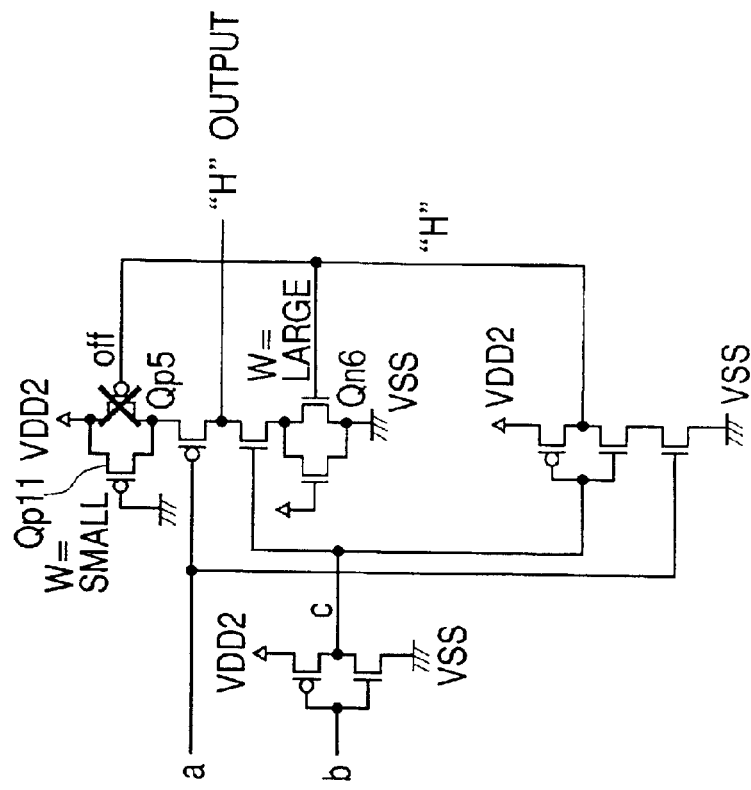
FIGS. 3A and 3B are circuit diagrams showing the operating states of the output stage of the level conversion circuit of FIG. 1.
Figure 3A:
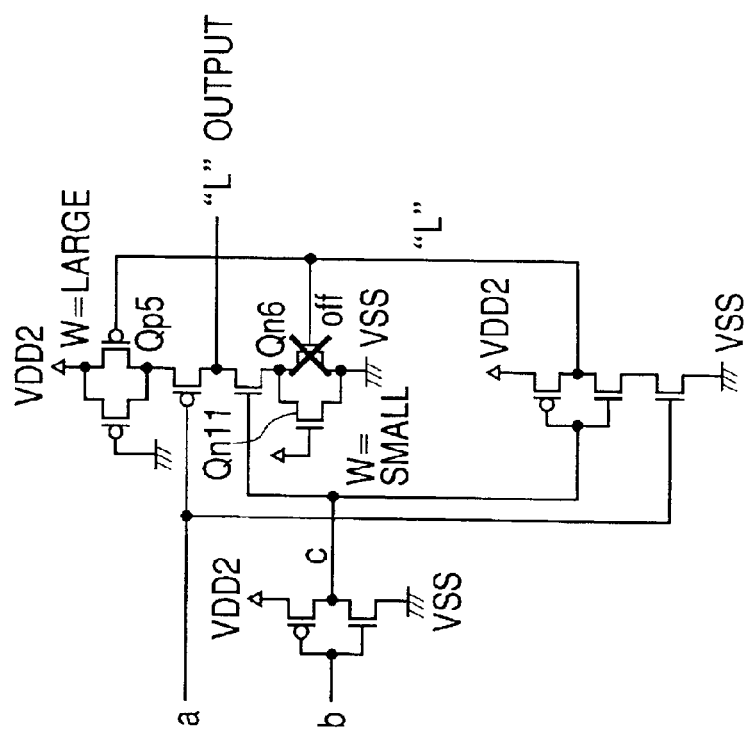

Moreover, when the input to the output stage 14 varies from a high level to a low level and the output signal is switched from a low level to a high level, the p-channel MOSFET Qp5 having a greater gate width is turned on and the n-channel MOSFET Qn6 is turned off as shown in FIG. 3(A) and, because the MOSFET Qn11 for high resistance use is narrower in gate width, the overall logical threshold of the output stage 14 is shifted toward the higher side than when both Qp5 and Qn6 are on. As a result, the switching of the output from a low level to a high level is accelerated.

Next will be considered a case in which the input signal IN varies from a high level to a low level. As the input signal is at a high level in the preceding state, the n-channel MOSFET Qn5 of the output stage 14 is in an on state and the p-channel MOSFET Qp6 is in an off state; the output of the delay stage 15 is at a low level to turn off the n-channel MOSFET Qn6 of the output stage 14 and to turn on the p-channel MOSFET Qp5. As a result, the output stage 14 is in a state of giving a low level output via the n-channel MOSFETs Qn5 and Qn11 in an on state.

When the input signal IN varies from a high level to a low level in this state, the n-channel MOSFET Qn3, to whose gate terminal the signal/IN inverted by the inverter 11 is inputted is shifted from an off state to an on state. As the n-channel MOSFET Qn3 has a greater gate width than the p-channel MOSFET Qp3 in the level shift stage 12, the output node n2 varies promptly from a high level to a low level. However, the variation of the output node n2 from a high level to a low level is slower than that of the output node n1 from a high level to a low level by the delay by the inverter 11. Yet, while the variation of the output node n1 from a high level to a low level is transmitted to the output stage 14 via the inverter 13, this variation of the output node n2 from a high level to a low level is promptly transmitted to the output stage 14 via the inverter 13, resulting in substantially equal lengths of transmission time between them.

On the other hand, the n-channel MOSFET Qn2 of the level shift stage 12 is shifted from an on state to an off state when the input signal IN varies from a high level to a low level. The p-channel MOSFET Qp2 is shifted from an off state to an on state in response to the variation of the output node n2 to a low level by the shifting of the n-channel MOSFET Qn3 from an off state to an on state by the inverted input signal/IN. Then as the p-channel MOSFET Qp2 is narrower in gate width than the n-channel MOSFET Qn2, the variation of the output node n1 from a low level to a high level takes place relatively slowly but not very slowly because the variation of the output node n2 from a high level to a low level is relatively rapid as stated above. The potential variation of the output node n1 is transmitted to the gate terminal of the MOSFET Qn5 of the output stage 14 via the inverter 13 at a somewhat delayed timing to shift Qn5 from an on state to an off state.

When the output varies from a low level to a high level as stated above, with a slight delay the delay stage 15 turns off the p-channel MOSFET Qp5 of the output stage 14 and turns on the n-channel MOSFET Qn6, and the output stage 14 is thereby made immediately responsive to the next variation of the input signal from a low level to a high level. Thus in the early phase of the variation of the input signal from a low level to a high level, a current flows through the n-channel MOSFET Qn6 turned on by the preceding signal, and the output potential rapidly varies toward the ground potential. When this variation proceeds to a certain extent, Qn6 is turned off, and after that the output potential is fixed via the MOSFET Qn11 functioning as a resistor. The same is true of the operation in the reverse direction.

Moreover, as stated above, since the level conversion circuit embodying the invention in this manner is designed to have a Wp3:Wn3 ratio of 1:15 between the gate widths of the p-channel MOSFET Qp3 generating the signal on the non-inverted output node n2 side of the level shift stage 12 and the n-channel MOSFET Qn3, i.e. Wn3 is greater than Wp3, the signal variation at the node n2 from a high level to a low level is faster than in the conventional level conversion circuit shown in FIG. 10. Also, when the input to the output stage 14 varies from a low level to a high level to switch the output signal from a high level to a low level, the p-channel MOSFET Qp5 having a greater gate width is off and the n-channel MOSFET Qn6 is off as shown in FIG. 3(B). As the MOSFET Qp11 for high resistance use is narrower in gate width, the overall logical threshold of the output stage 14 is shifted toward the lower side than when both Qp5 and Qn6 are on. As a result, the switching of the output from a high level to a low level is accelerated.

Figure 11:
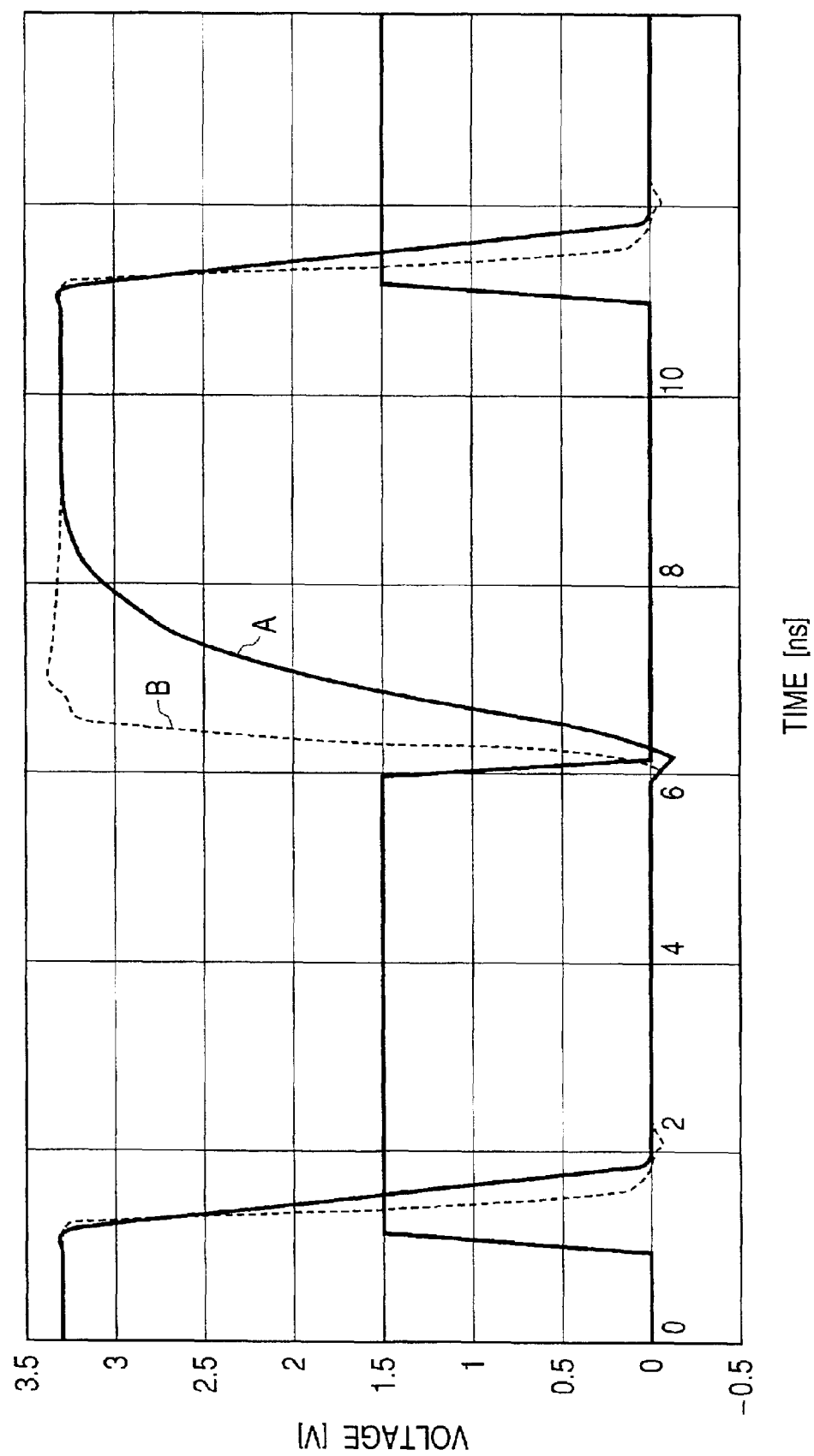
FIG. 11 is a waveform diagram of input/output signals obtained by the simulation of a level conversion circuit embodying the invention and another level conversion circuit embodying the prior art.

Even though the signal transmission from the inverted output node n1 of the level shift stage 12 to the output stage 14 takes places via the inverter 13, the delay by this inverter 13 is about equal to that by the inverter 11 on the signal transmission path on the negative phase side of the level shift stage 12. Accordingly, as indicated by broken line B in FIG. 11, the rise of the output of this level conversion circuit to a high level is faster than in the conventional level conversion circuit. The waveforms shown in FIG. 11 were obtained by the simulation of this level conversion circuit embodying the invention and the level conversion circuit embodying the prior art.

Figure 4:
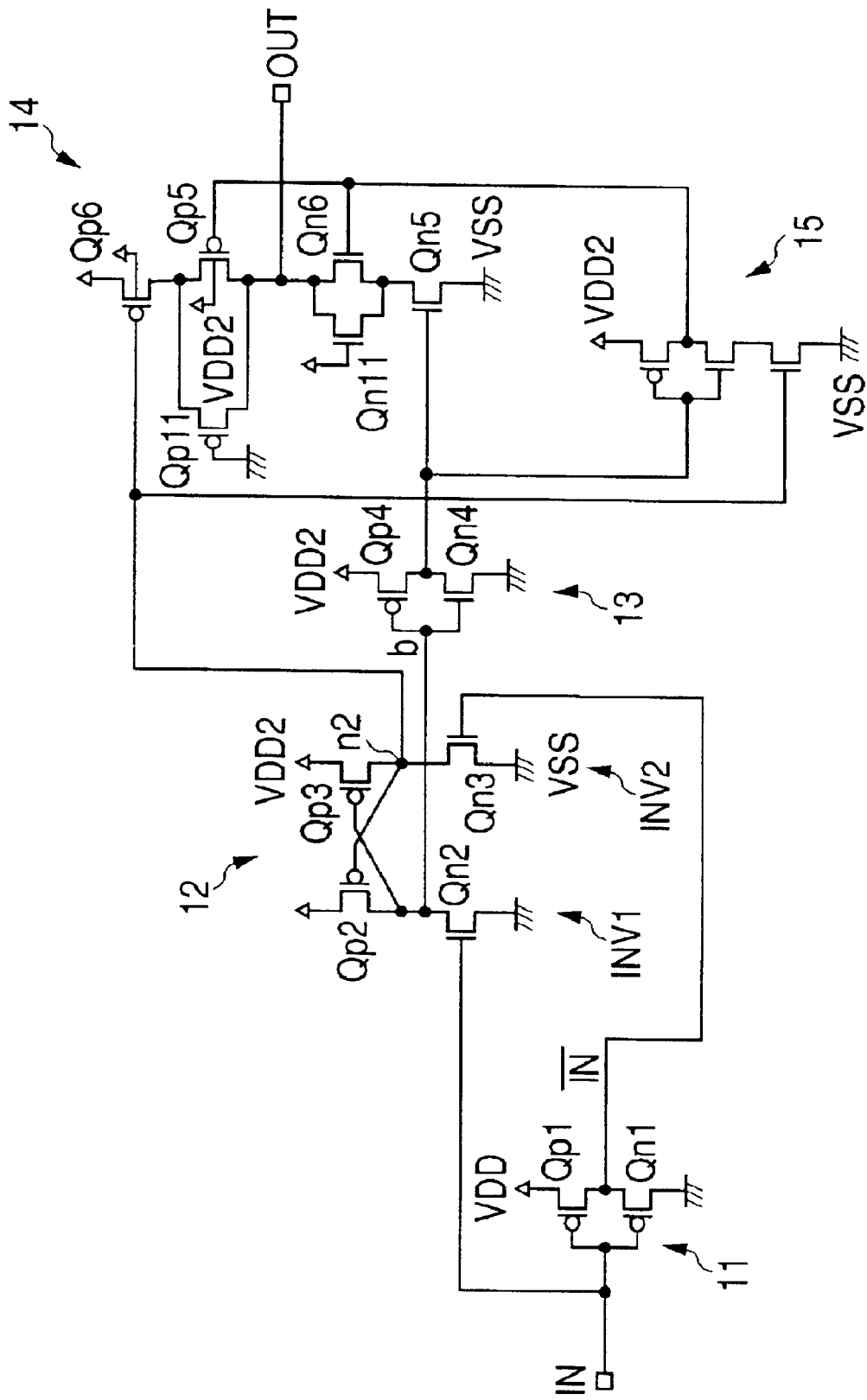
FIG. 4 is a circuit diagram of a variation of the level conversion circuit according to the first preferred embodiment of the invention.

FIG. 4 is a circuit diagram of a variation of the level conversion circuit shown in FIG. 1. In the level conversion circuit of FIG. 4, the connective relationship of the p-channel MOSFETs Qp5 and Qp11 to Qp6 of the output stage 14 in the level conversion circuit of FIG. 1 is reversed, and that of the n-channel MOSFETs Qn6 and Qn11 to Qn5 is also reversed.

In the circuit illustrated in FIG. 1, in order to prevent the pn junction between the source-drain region and the well region of each MOSFET from being biased in the forward direction to let a leak current flow, the potentials of the n-type well regions of the p-channel MOSFETs Qp5 and Qp6 are kept at VDD2, the highest level in the chip, and those of the p-type well regions of the n-channel MOSFETs Qn5 and Qn6 are kept at the ground potential level, the lowest in the chip. For this reason, the source potential of Qp6 which is the MOSFET for drive use is brought down by the potential drop due to the on-resistance of Qp5, resulting in a higher well potential than the source potential. Conversely, the well potential of Qn5 becomes lower than the source potential.

As a result, the back bias effect of the well potential raises the thresholds of Qp5 and Qn6. Accordingly, if the p-channel MOSFETs Qp5 and Qp6 are of the same size (gate width) and so are the n-channel MOSFETs Qn6 and Qn5, it is preferable for the connective relationship of Qp5 and Qp11 to Qp6 and that of Qn6 and Qn11 to Qn5 to be reversed from the respective relationships in FIG. 1 as shown in FIG. 4, so that the source of the MOSFET Qp6 for drive use be connected to the source voltage VDD2 and the source Qn5 be connected to the grounding point.

It is to be noted, however, that the connective relationships shown in FIG. 1 are desirable for the circuit of FIG. 1 because the gate width Wp5 of Qp5 is set greater than the gate width Wp6 of Qp6 and the gate width Wp6 of Qn6 is set greater than the gate width Wn5 of Qn5. If, with these relationships in size kept as they are, the connective relationship of Qp5 and Qp11 to Qp6 is reversed and that of Qn6 and Qn11 to Qn5 is also reversed, the parasitic capacitance between the source-drain and the well will be greater in Qp5 and Qn6 which are larger in size. For this reason, both the source-well parasitic capacitances and the drain-well parasitic capacitances of Qp5 and Qn6 become visible as the load capacitances of the MOSFETs Qp6 and Qn5 for drive use, and the signal variation is slowed down accordingly.

When the connective relationship of Qp5 and Qp11 to Qp6 and that of Qn6 and Qn11 to Qn5 are as shown in FIG. 1, the sources of Qp5 and Qn6 are connected to the source voltage, with the result that only the drain-well parasitic capacitances of Qp5 and Qn6 are visible as the load capacitances of the MOSFETs Qp6 and Qn5 for drive use and the signal variation is faster than when the connective relationships are in the other way. Furthermore, as described with reference to the embodiment shown in FIG. 1, where the MOSFETs Qp6 and Qn5 for drive use are smaller in size (gate width), the gate capacitances become small, resulting in less load capacitances for the preceding circuit, while greater sizes (gate widths) of Qp5 and Qn6 would reduce the on-resistances and accordingly facilitate faster operation.

Figure 5:
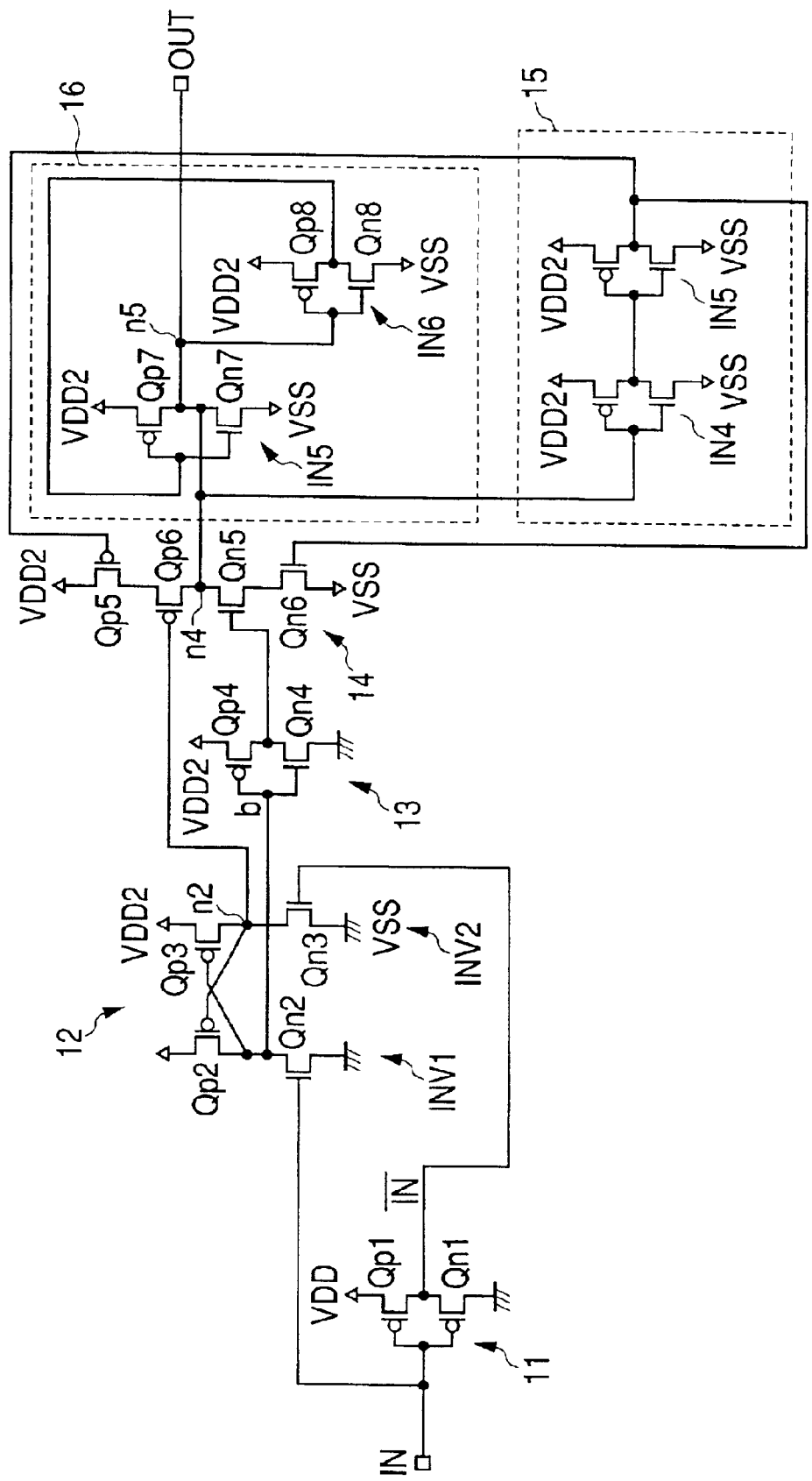
FIG. 5 is a circuit diagram of a voltage boost type level conversion circuit, which is a second preferred embodiment of the invention.

FIG. 5 illustrates another level conversion circuit, which is a second preferred embodiment of the invention. The level conversion circuit shown in FIG. 5 is configured of an inverter 11 for inverting an input signal IN, a latch circuit type level shift stage 12 whose inputs are a signal/IN resulting from inversion by the inverter 11 and the pre-inversion signal IN, an inverter 13 for inverting the signal on the inverted output node n1 side of the level shift stage 12, a push-pull type output stage 14 whose inputs are the output signal of the inverter 13 and the signal on the non-inverted output node n2 side of the level shift stage 12, a delay stage 15 for delaying the output signal of the output stage 14 to apply feedback to the output stage 14, and an output latch stage 16 for latching the signal of the output node n4 of the output stage 14. Since the inverter 11, the level shift stage 12 and the inverter 13 have the same configurations as their respective counterparts in the embodiment shown in FIG. 1, their detailed description is dispensed with.

The output stage 14 consists of two p-channel MOSFETs Qp5 and Qp6 and two n-channel MOSFETs Qn5 and Qn6 connected in series, and signals on the non-inverted output node n2 side of the level shift stage 12 and signals resulting from inversion of signals by the inverter 13 on the inverted output node n1 side are applied to the gate terminals of Qp6 and Qn5. The output terminal OUT of the circuit is connected to the output node n4 of this output stage 14, and any variation in the potential at the output node n4 of this output stage 14 is immediately reflected in the output terminal OUT. The output signal of the delay stage 15 is applied to the gate terminals of the MOSFETs Qp6 and Qn5. Qp5 is shifted to an on/off state reverse to that of Qp6 a little later than Qp6, and Qn6 is shifted to an on/off state reverse to that of Qn5 a little later than Qn5.

The gate width Wp6 of the p-channel MOSFET Qp6 constituting the output stage 14 is so designed that its ratio to the gate width Wp2 of the p-channel MOSFETs Qp2 and Qp3 of the level shift stage 12, i.e. Wp6:Wp2, be about 10:1. On the other hand, the ratio of the gate width Wn5 of the n-channel MOSFET Qn5 constituting the output stage 14 to the gate width Wn2 of the n-channel MOSFETs Qn2 and Qn3 constituting the level shift stage 12, i.e. Wn5:Wn2, is designed to be about 1:3.

The delay stage 15, consisting of two inverters INV4 and INV5 connected in cascade, delays the output of the output stage 14 to apply feedback to the gate terminals of the p-channel MOSFET Qp5 and the n-channel MOSFET Qn6 constituting the output stage 14 with a signal in the same phase as the output signal of the output stage 14. Therefore, the p-channel MOSFET Qp5 and the n-channel MOSFET Qn6 constituting the output stage 14 are subjected to on/off control in a complementary manner, with the result that, a little later than the variation of the output signal of the output stage 14 to a high level, the n-channel MOSFET Qn6 is turned on and the p-channel MOSFET Qp5 is turned off. Also, a little later than the variation of the output signal of the output stage 14 to a low level, n-channel MOSFET Qn6 is turned off and the p-channel MOSFET Qp5 is turned on.

Thus, when the input signal to the output stage 14 varies to a high level to turn off the p-channel MOSFET Qp6 and to turn on the n-channel MOSFET Qn5, the output varies to a low level, followed with a brief time lag by the turning-off of Qn6 and the shift of the output node n4 to a high impedance. Also, when the input signal of the output stage 14 varies to a low level to turn on the p-channel MOSFET Qp6 and to turn off the n-channel MOSFET Qn5, the output varies to a high level, followed with a brief time lag by the turning-off of Qp5 and the shift of the output node n4 to a high impedance.

Even though the output node n4 of the output stage 14 takes on a high impedance as described above, the preceding latch of the output potential of the output stage 14 by the output latch stage 16 keeps the potential of the output terminal OUT in the immediately preceding state. Moreover, once the output potential of the output stage 14 is made definite, the MOSFETs Qp5 and Qn6 of the output stage 14 are promptly shifted by the delay stage 15 into an on/off state reverse to that of QP6 and Qn5. As a result, the output stage 14 can be thereby made immediately responsive to the next variation of the input signal.

The output latch stage 16, configured of a CMOS inverter INV6 for inverting the output signal of the output stage 14 and a CMOS inverter INV5 for further inverting the output of the inverter INV6, supplies a signal in the same phase as the output signal of the output stage 14 upon connection of the output node n5 of the inverter INV5 to the output terminal OUT of the circuit and, even if the output node n4 of the output stage 14 is placed in a high impedance state, maintains the output potential of immediately before. The MOSFETs Qp8 and Qn8 constituting the inverter INV6 of the first stage are formed to be less in drive power, i.e. gate width, than the MOSFETs Qp5 and Qn5 constituting the output stage 14, so that when the output stage 14 is so driven as to invert the potential of the output node n4 of the output stage 14, the potential of the output node n5 of the output latch stage 16 is also inverted.

Next will be described the operation of the level conversion circuit embodying the invention as illustrated in FIG. 5.

First will be considered a case in which the input signal IN varies from a low level to a high level. As the input signal is at a low level in the preceding state, the n-channel MOSFET Qn5 of the output stage 14 is in an off state and the p-channel MOSFET Qp6 is in an on state; the output of the delay stage 15 is at a high level to turn on the n-channel MOSFET Qn6 of the output stage 14 and to turn off the p-channel MOSFET Qp5. As a result, through the output stage 14 is in a high impedance state, the output is kept at a high level because the output state immediately after the variation of the output node n4 is latched by the output latch circuit 16.

When the input signal IN varies from a low level to a high level in this state, because the n-channel MOSFET Qn2 has a greater gate width than the p-channel MOSFET Qp2 in the level shift stage 12, the output node n1 promptly changes from a high level to a low level. This change in potential is transmitted to the gate terminal of the MOSFET Qn5 of the output stage 14 via the inverter 13 at a somewhat delayed timing, and shifts Qn5 from an off state to an on state.

On the other hand, the n-channel MOSFET Qn3 of the level shift stage 12 is turned off by the output signal of the inverter 11 for inverting the input signal IN a little later than the turning-on of Qn2. Then the shifting of the p-channel MOSFET Qp3 from an off state to an on state is begun relatively promptly by the potential variation of the output node n1 to a low level. However, as the p-channel MOSFET Qp3 is narrower in gate width than the n-channel MOSFET Qn3, the variation of the output node n2 from a low level to a high level is a little slower than that of the output node n1 from a high level to a low level. This potential variation is immediately transmitted to the gate terminal of the MOSFET Qp6 of the output stage 14 to shift Qp6 from an on state to an off state. As a result, the output promptly varies from a high level to a low level.

As described above, the signal transmitting the positive phase side of the level shift stage 12 is transmitted to n-MOS of the output stage 14 via the inverter 13, and the signal transmitting the negative phase side of the level shift stage 12 is transmitted to p-MOS of the output stage 14 via the inverter 11. Since a delay equivalent to one inverter stage is thus given to each, the signals on the two sides arrive at substantially the same time. Furthermore, as the level conversion circuit embodying the invention in this way is so designed that the gate width ratio Wp2:Wn2 between the n-channel MOSFET Qn2 and the p-channel MOSFET Qp2 be 1:15, i.e. Wn2 be greater than Wp2, the signal variation is faster then in the conventional level conversion circuit shown in FIG. 10. Therefore, in spite of the presence of the inverter 13, the fall of the output to a low level takes place at comparable speed to the conventional level conversion circuit.

Next will be considered a case in which the input signal IN varies from a high level to a low level. As the input signal is at a high level in the preceding state, the n-channel MOSFET Qn5 of the output stage 14 is in an on state and the p-channel MOSFET Qp6 is in an off state; the output of the delay stage 15 is at a low level to turn off the n-channel MOSFET Qn6 of the output stage 14 and to turn on the p-channel MOSFET Qp5. As a result, the output stage 14 is in a high impedance state, but the output is maintained at a low level because the output state immediately after the variation of the output node n4 to a low level is latched by the output latch circuit 16.

When the input signal IN varies from a high level to a low level in this state, the n-channel MOSFET Qn3, to whose gate terminal the signal/IN inverted by the inverter 11 is inputted, is shifted from an off state to an on state. As the n-channel MOSFET Qn3 has a greater gate width than the p-channel MOSFET Qp3 in the level shift stage 12, the output node n2 varies promptly from a high level to a low level. However, the variation of the output node n2 from a high level to a low level is slower than that of the output node n1 from a high level to a low level by the delay by the inverter 11. Yet, while the variation of the output node n1 from a high level to a low level is transmitted to the output stage 14 via the inverter 13, this variation of the output node n2 from a high level to a low level is promptly transmitted to the output stage 14 via the inverter 13, resulting in substantially equal lengths of transmission time between them.

On the other hand, the n-channel MOSFET Qn2 of the level shift stage 12 is shifted from an on state to an off state when the input signal IN varies from a high level to a low level. The p-channel MOSFET Qp2 is shifted from an off state to an on state in response to the variation of the output node n2 to a low level by the shifting of the n-channel MOSFET Qn3 from an off state to an on state by the inverted input signal/IN. Then as the p-channel MOSFET Qp2 is narrower in gate width than the n-channel MOSFET Qn2, the variation of the output node n1 from a low level to a high level takes place relatively slowly but not very slowly because the variation of the output node n2 from a high level to a low level is relatively rapid as stated above.

The potential variation of the output node n1 is transmitted to the gate terminal of the MOSFET Qn5 of the output stage 14 via the inverter 13 at a somewhat delayed timing to shift Qn5 from an on state to an off state. However, the output of the inverter 13 varies relatively rapidly because the p-channel MOSFET Qp4 is designed to be greater than the n-channel MOSFET Qn4 in gate width, and the signal transmission from the output node n1 to the gate terminal of the MOSFET Qn5 of the output stage 14 takes place promptly. As a result, the potential, i.e. the voltage, at the output node n3 of the output stage 14 promptly varies from a low level to a high level.

When the output varies from a low level to a high level as stated above, with a slight delay the delay stage 15 turns off the p-channel MOSFET Qp5 of the output stage 14 and turns on the n-channel MOSFET Qn6, and the output stage 14 is thereby placed in a high impedance state. In that while, the potential of the output stage 14 is latched by the latch output circuit 16 to maintain the output in a high level state.

As stated above, since the level conversion circuit embodying the invention in this manner is designed to have a Wp3:Wn3 ratio of 1:15 between the gate widths of the p-channel MOSFET Qp3 generating the signal on the non-inverted output node n2 side of the level shift stage 12 and the n-channel MOSFET Qn3, i.e. Wn3 is greater than Wp3, the signal variation is faster than in the conventional level conversion circuit shown in FIG. 10. Along with that, even though the signal transmission from the inverted output node n1 to the output stage 14 takes place via the inverter 13, the rise of the output of this level conversion circuit to a high level is faster than in the conventional level conversion circuit because the delay by the inverter 13 is about equal to that by the inverter 11 on the signal transmission path on the negative phase side of the level shift stage 12.

Figure 6:
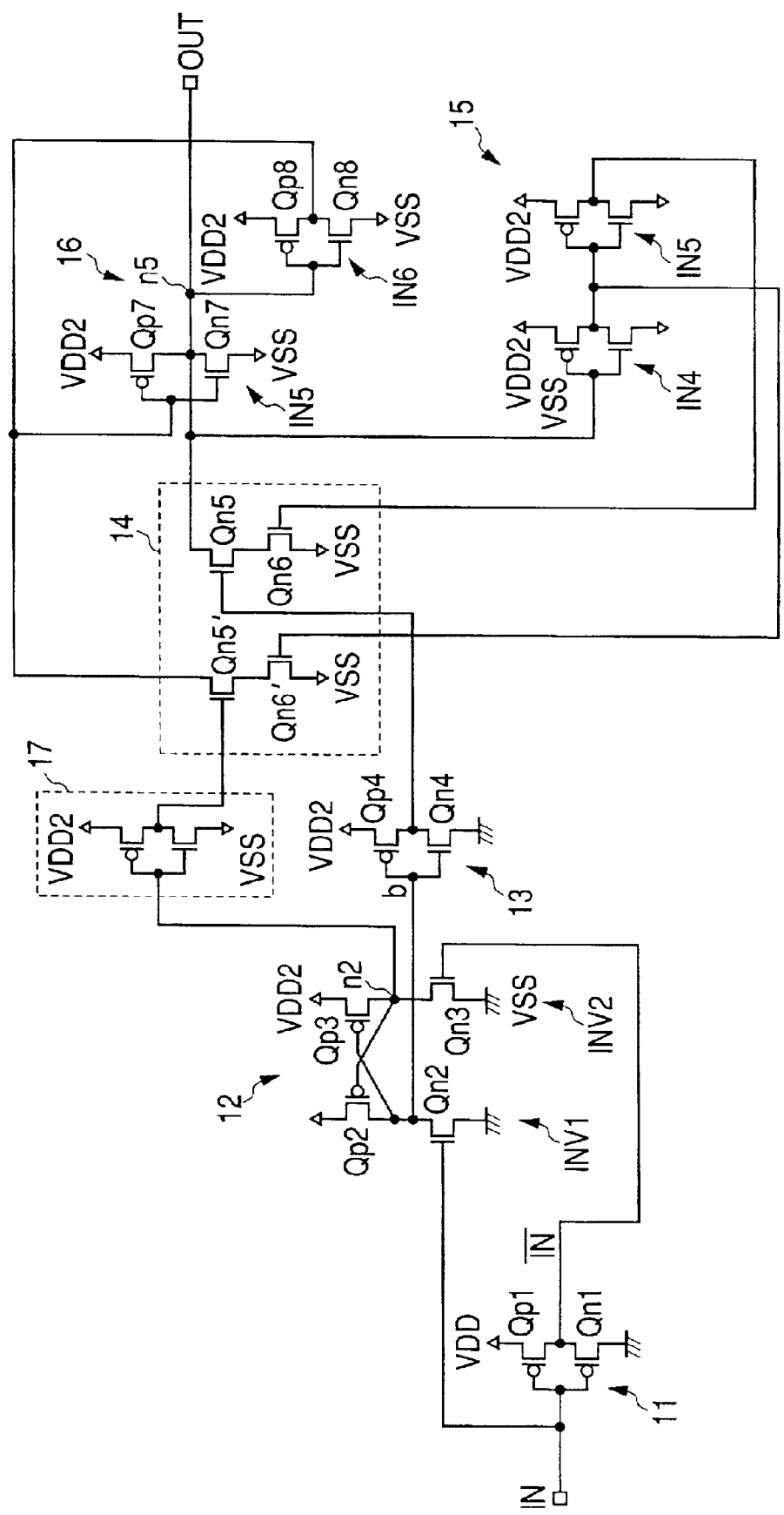
FIG. 6 is a circuit diagram of a variation of the level conversion circuit according to the second preferred embodiment of the invention.

FIG. 6 is a circuit diagram of a variation of the level conversion circuit shown in FIG. 5. In the circuit of FIG. 6, in place of the p-channel MOSFETs Qp5 and Qp6 constituting the output stage 14 in the circuit of FIG. 5, n-channel MOSFETs Qn5' and Qn6' are used, and an inverter 17 is also provided between the non-inverted output node n2 of a level shift stage 12 and an output stage 14 to drive the MOSFETs Qn5' and Qn6'. Further, so that signals generated by the n-channel MOSFET Qn5' and Qn6' can invert an output latch stage 16 to a logical state reverse to the logic by Qn5 and Qn6 (output at a low level), the drain terminal of the MOSFET Qn5' is connected to the input terminal of a CMOS inverter INV5 of the output latch stage 16. The configuration of this embodiment is the same as the circuit of FIG. 3 in all other respects. The level conversion circuit embodying the invention in this manner also has an advantage of a faster output signal rise than in the conventional level conversion circuit.

Figure 7:
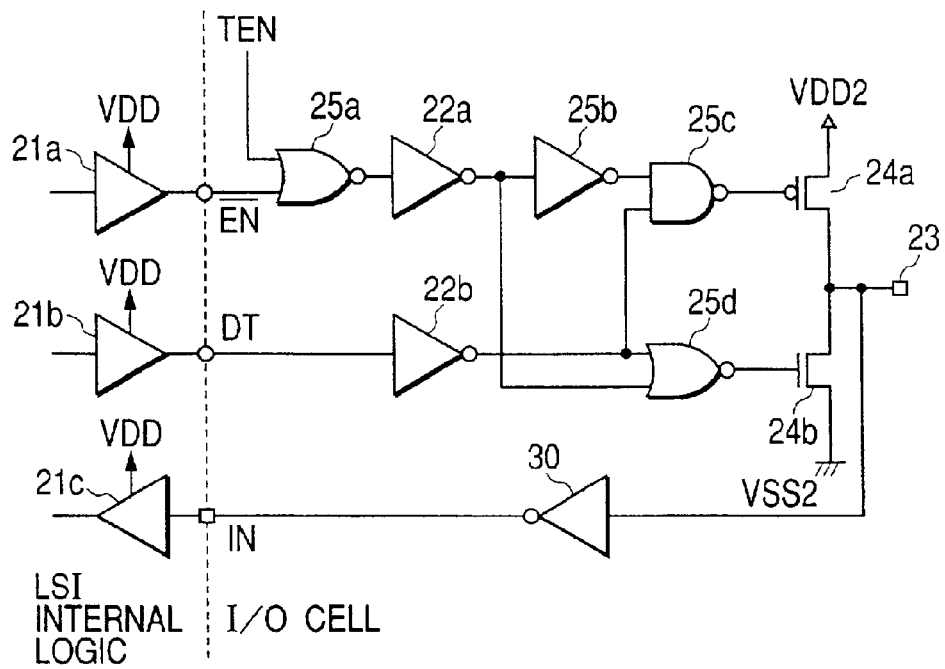
FIG. 7 shows the logical configuration of a typical example of application of the level conversion circuit according to the invention to a bidirectional buffer circuit.

FIG. 7 illustrates the configuration of an example of application of the level conversion circuit according to the invention to a bidirectional buffer circuit. The bidirectional buffer circuit shown in FIG. 7 is suitable for a semiconductor integrated circuit designed to have its internal circuits operate on a source voltage of, for instance 1.5 V and transmit and receive signals to and from other LSIs via an interface of an LV-TTL level, such as 0 V to 3.3 V.

In FIG. 7, reference numerals 21a and 21b denote logic circuits; 22a and 22b, voltage boost type level conversion circuits described with reference to an earlier cited embodiment; 23, an external terminal; 24a and 24b MOSFETs for output use connected in series between a source voltage VDD2 and the grounding point; and 25a through 25d, logical gate circuits for generating signals to control the gates of the MOSFETs 24a and 24b for output use. A tristate output buffer circuit is configured of the level conversion circuits 22a and 22b, the MOSFET 24a and 24b for output use, and the logical gate circuits 25a through 25d. Reference numeral 30 denotes an input buffer circuit consisting of a voltage depressing type level conversion circuit; and 21c, an internal circuit.

A data signal to be outputted from the internal circuit 21b is inputted to 24a out of the level conversion circuits 24a and 24b, and to 24b is inputted an output signal of a NOR gate 25a to provide a logical sum of a data enable signal EN supplied from an internal circuit and a testing enable signal TEN supplied from an external terminal (not shown) of the like. The source voltages of the internal circuits 21a and 21b and the NOR gate 25a are VDD (e.g. 1.5 V), and the amplitudes of their output signals range from 0 V to VDD.

The source voltages of the level conversion circuits 22a and 22b are VDD2 (e.g. 3.3 V), and the source voltages of logical gates 25b, 25c and 25d which respectively receive the output signals of 0 V to VDD in amplitude of the internal circuits 21a and 21b and of the NOR gate 25a and converting them into signals of 0 V to VDD2 in amplitude are also VDD2.

In the output buffer of this embodiment, when either the data enable signal EN or the testing enable signal TEN is shifted to a low level, control signals are applied to the gate terminals of the MOSFETs 24a and 24b for output use to turn them off irrespective a data signal DT from the internal circuit 21b, and this places the external terminal 23 in a high impedance state. On the other hand, when both the data enable signal EN and the testing enable signal TEN are shifted to a high level, one of the MOSFETs 24a and 24b for output use is turned on and the other is turned off in response to the data signal DT from the internal circuit 21b, and this causes VDD2 or the ground potential (0 V) to be supplied to the external terminal 23.

The testing enable signal TEN is used for placing the output buffer circuit of this embodiment in a high impedance state when, for instance, an external terminal to which the bidirectional buffer of this embodiment is connected is further connected to an external bus or the like, and a signal is to be entered into another semiconductor integrated circuit connected to that external bus. In the embodiment shown in FIG. 7, it is also possible to arrange the level conversion circuits 22a and 22b between the logical gates 25c and 25d and the gate terminals of the MOSFETs 24a and 24b for output use. However, as the MOSFETs 24a and 24b for output use are large in element size, the constituent elements of the preceding circuit for driving their gates also have to be large. Therefore it is preferable to arrange the logical gates 25b through 25d immediately before the MOSFETs 24a and 24b for output use as in FIG. 7 than to arrange the level conversion circuits 22a and 22b involving many constituent elements immediately before the MOSFETs 24a and 24b for output use, because less space would be occupied in this way.

Figure 8:
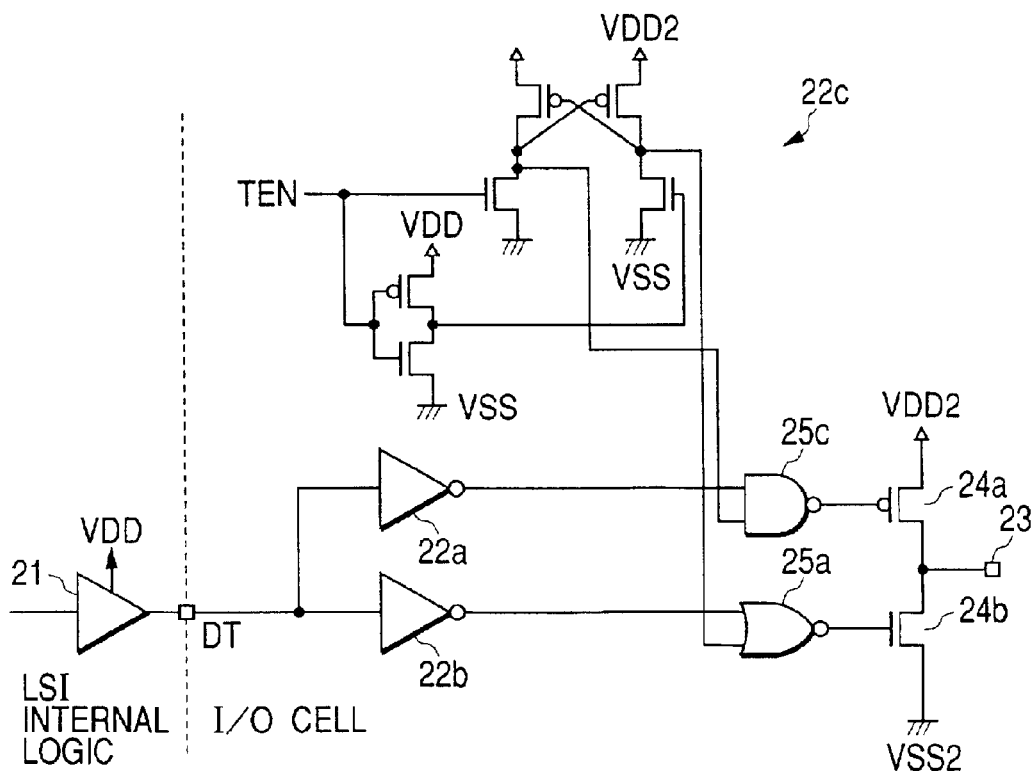
FIG. 8 shows the logical configuration of a typical example of application of the level conversion circuit according to the invention to an output buffer circuit.

FIG. 8 shows the logical configuration of a typical example of application of the level conversion circuit according to the invention to an output buffer circuit. While the circuit of FIG. 7 is a bidirectional buffer, this circuit of FIG. 8 is a unidirectional output buffer. There is no enable signal EN which would either permit or forbid the output of the data signal DT, and the data signal supplied from the internal circuit 21 is commonly entered into the level conversion circuits 22a and 22b provided respectively matching the MOSFETs 24a and 24b.

Further between the level conversion circuits 22a and 22b and the gate terminals of the MOSFETs 24a and 24b for output use, there are provided the logical gates 25c and 25d for allowing or intercepting the supply of the output signals of the level conversion circuits 22a and 22b to the gate terminals of the MOSFETs 24a and 24b for output use in response to the testing enable signal TEN. There is also provided a third level conversion circuit 22c for converting the testing enable signal TEN, where it is a low amplitude signal like internal signals, into a high amplitude signal and entering it into the logical gates 25c and 25d. However, since this third level conversion circuit 22c need not operate at high speed, it may use only the first part of the level conversion circuit shown in FIG. 1. Incidentally, the output signal of this third level conversion circuit 22c is commonly supplied to any other output buffer circuit connected to another external terminal (not shown) to accomplish similar control. It is also possible to integrate the level conversion circuits 22a and 22b into a single circuit by using larger constituent elements or otherwise. Furthermore, in this embodiment, too, the level conversion circuits 22a and 22b can be arranged between the logical gates 25c and 25d and the gate terminals of the MOSFETs 24a and 24b for output use.

Figure 9:
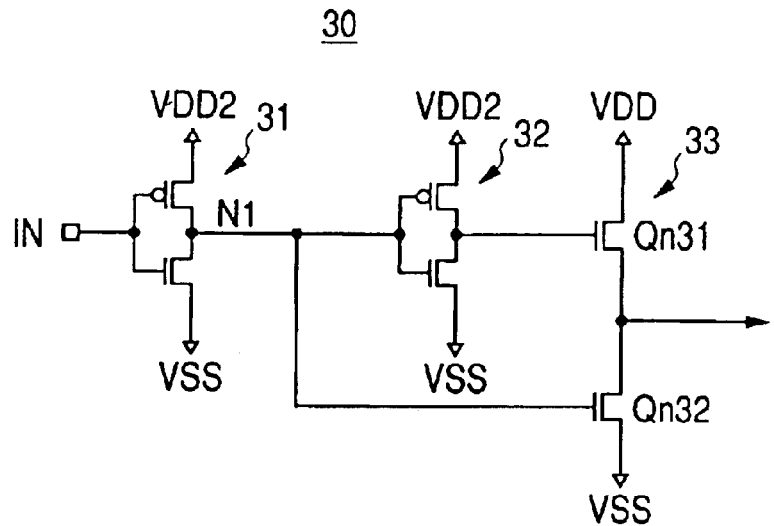
FIG. 9 is a circuit diagram of an example of voltage depressing type level conversion circuit constituting an input buffer circuit.

FIG. 9 shows a specific example of circuitry for an input buffer 30 consisting of a voltage depressing type level conversion circuit provided in the bidirectional buffer circuit of FIG. 7. As illustrated in FIG. 7, the input buffer 30 is configured of a first stage CMOS inverter 31 for receiving the input signal IN entered from the external terminal 23, a second stage CMOS inverter 32 for inverting the output of the CMOS inverter 31, and an inverter 33 consisting of two n-channel MOSFETs Qn31 and Qn32 in series for receiving at its gate terminals the outputs of the inverters 31 and 32. The inverters 31 and 32 are operated a source voltage VDD2, which may be 3.3 V or the like matched with an external interface level, and the third stage inverter 33 is operated with a source voltage VDD, which may be 1.5 V or the like equalized to the internal source voltage, and converts a signal of 0 to 3.3 V amplitude entered from outside into a signal of 0 to 1.5 V amplitude for supply to the internal circuit 21c.

Figure 12:
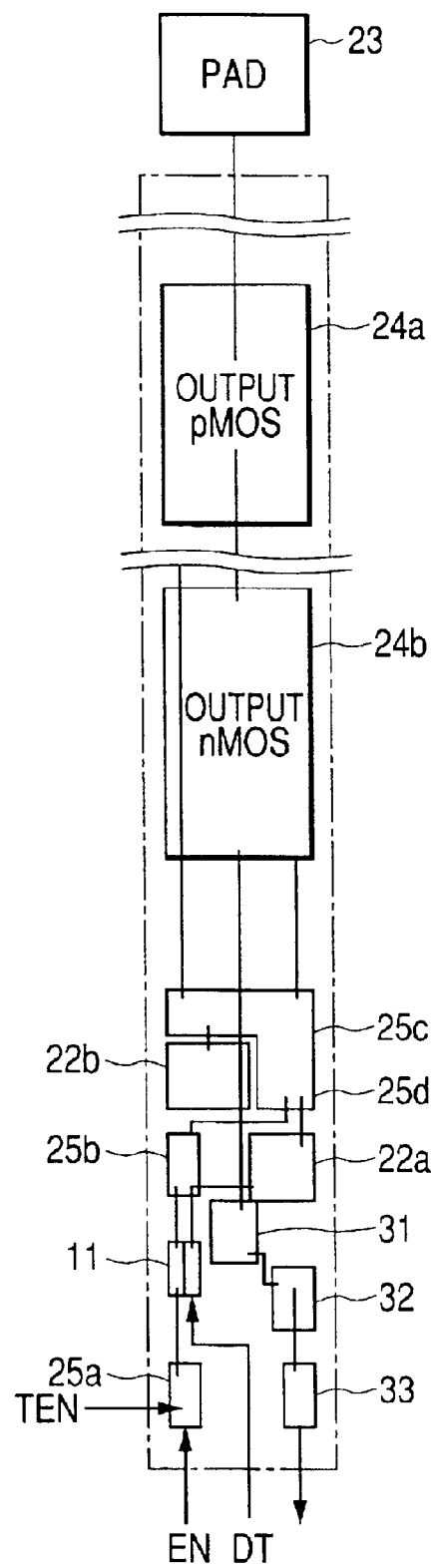
FIG. 12 shows an example of layout of various logic gates and elements constituting the bidirectional buffer circuit of FIG. 7 over a semiconductor chip.

FIG. 12 shows an example of layout of various logic gates and elements constituting the bidirectional buffer circuit of FIG. 7 over a semiconductor chip. In FIG. 12, blocks assigned the same reference signs as in FIG. 7 denote respectively the same logical gates and elements. The layout illustrated in FIG. 12 makes it possible to so arrange, even where a plurality of I/O pads 23 are provided in parallel, the bidirectional buffer circuit as to match the pad with, and according to avoid any waste of space.

Figure 13:
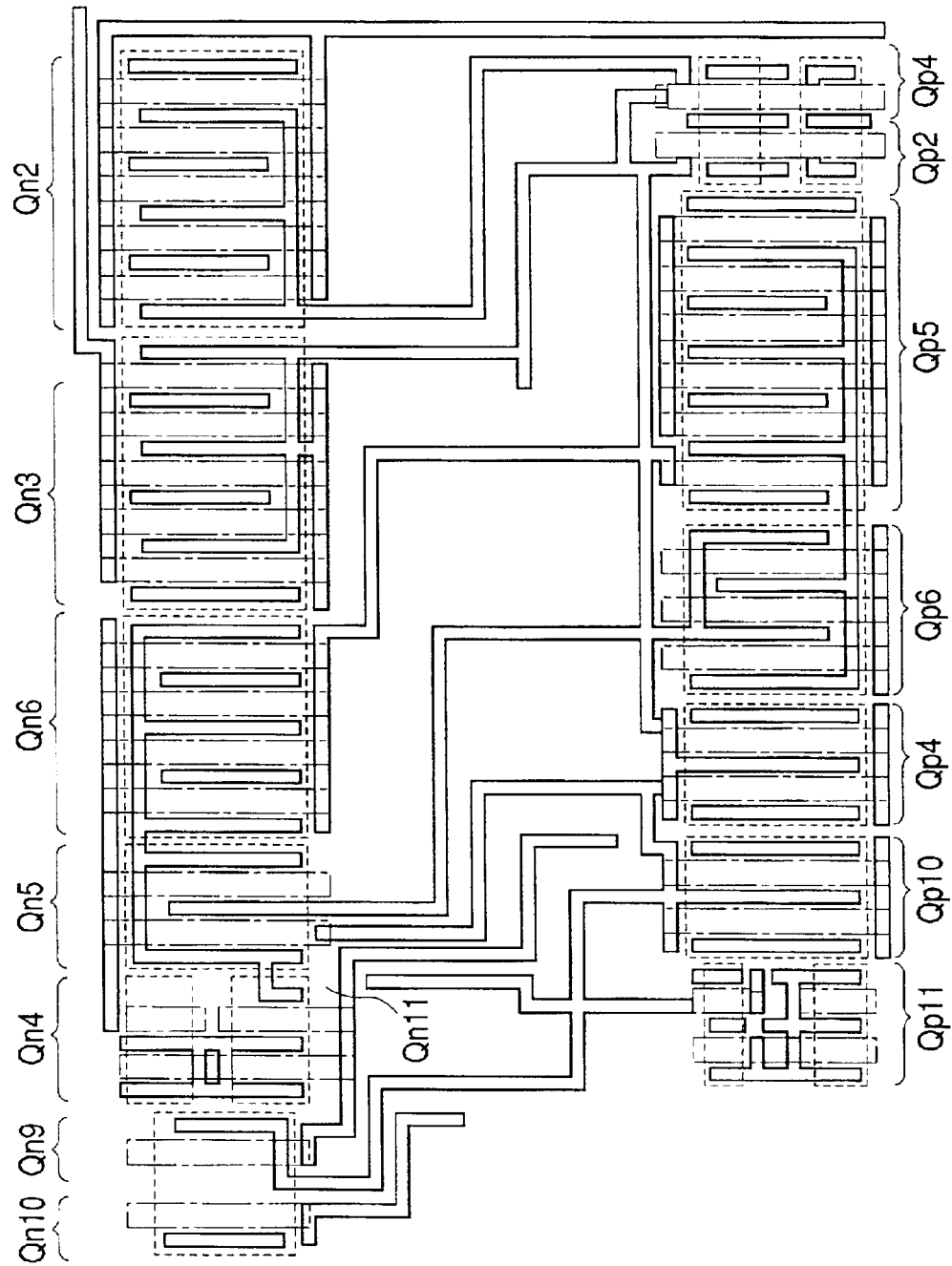
FIG. 13 shows an example of layout of elements constituting level conversion circuits to which the invention is applied.

FIG. 13 shows an example of layout of elements constituting the level conversion circuits 22a and 22b to which the invention is applied out of the blocks shown in FIG. 12. In FIG. 13, solid lines represent wiring consisting of layers of metal such as aluminum; two-dot chain lines, gate electrodes consisting of polysilicon layers or the like; broken lines, diffusion layers to constitute the source-drain region of the MOSFETs.

The central part where there is no element is the wiring area, where power supply lines (not shown), wiring to connect the n-channel MOSFETs and the p-channel MOSFETs and the like are formed by using a multi-layer wiring technique. In FIG. 13, wiring represented in the central wiring area is only part but not all of the wiring. Signs in FIG. 13 denote the portions wherein the same elements constituting the circuit of and bearing the same reference signs as in FIG. 1 are formed, though the MOSFET Qp9 in FIG. 1 is dispensed with in FIG. 13.

As described with reference to the embodiment shown in FIG. 1, the MOSFETs Qn2, Qn3, Qp5, Qp6 and Qn6 are designed to be somewhat greater in the gate width than other elements. When laying out MOSFETs of greater gate widths on a semiconductor substrate, trying to linearly arrange gate electrodes would result in a element shape extremely long in one direction and, where internal circuits are to be configured of a gate array or the like, the gate array portion will become hardly compatible with the well region, and the well region of the I/O buffer circuit will have to be designed separately from the gate array portion.

Then, in this embodiment, the well regions of elements in the I/O buffer circuit portion are designed in common with the gate array portion to ensure compatibility more easily by splitting and arranging in parallel the gate electrodes of elements larger in gate width, such as the MOSFETs Qn2, Qn3, Qp5, Qp6 and Qn6. When splitting the gate electrodes, it is conceivable to split the diffusion layer of the source-drain region of each split gate electrode, but splitting the diffusion layers as well would invite a drop in area efficiency. Therefore in this embodiment, elements larger in gate width, such as the MOSFETs Qn2, Qn3, Qp5, Qp6 and Qn6, are so designed that even if their gate electrodes be split but their diffusion layers be not.

Further in this embodiment, for elements relatively small in gate width, such as the MOSFETs Qp2, Qp4, Qn4, Qn11 and Qp11, standby MOSFETs Qp2', Qp4', Qn4', Qn11' and Qp11' whose gate electrodes are split are provided in the vicinities of their respective regular counterparts. Out of the MOSFETs Qp2, Qp4, Qn4, Qn11 and Qp11, the gate width Wp2 of Qp2 and Qp4 is set smaller than the gate width Wn2 of the MOSFETs Qn2 and Qn3 respectively paired with them in a ratio of 1:15 for instance. The greater the gate width ratio, the more easily the stable D.C. operation can be accomplished, but too great a ratio would slow down the rise of the output nodes n1 and n2. Thus in the embodiment of FIG. 1, the gate width ratio Wp2:Wn2 in the level shift stage 12 is determined by a trade-off between the D.C. operation margin and the operating frequency.

Therefore, where standby MOSFETs Qp2' and Qp4' are provided, the circuit constant can be adjusted according to the target operating frequency of the circuit by selectively connecting or not connecting these elements at the time of wiring formation by the master slice method.

On the other hand, for the MOSFETs Qn4, Qn11 and Qp11, the logical thresholds of the inverter 13 and the output stage 14 are determined according to their gate width ratio to the MOSFETs Qp4, Qp6 and Qn5 respectively paired with them. Accordingly, if the standby MOSFETs Qn4', Qn11' and Qp11' are provided as stated above, the logical thresholds can be adjusted for the fine tuning of the rising or falling speed of signals by selectively connecting or not connecting these elements at the time of wiring formation by the master slice method.

The invention accomplished by the present inventor has been described so far with reference to specific embodiments thereof, but the invention is not limited to these embodiments and obviously can be modified in many different ways without deviating from the true scope and spirit thereof. For instance, though the inverter 13 is provided on the positive phase side of the level shift stage 12 in the embodiments of FIG. 1 and FIG. 4, this inverter 13 can be provided on the negative phase side of the level shift stage 12 as shown in FIG. 9. However, in such an arrangement, signals transmitted on the positive phase side of the level shift stage 12 will be delayed by an equivalent of three inverter stages while signals transmitted on the negative phase side of the level shift stage 12 will be delayed by an equivalent of one inverter stage, resulting in an imbalance. Accordingly, some contrivance would be needed, such as providing a greater load drive force on the p-MOS side of the delay stage 15 than that on the n-MOS side.

Although the foregoing description mainly referred to the application of the invention by the present inventor to an I/O buffer circuit having a level converting function, which belongs to the background of the inventive attempt, the invention is not limited to that, but can as well be applied to level conversion circuits in semiconductor integrated circuits.

Benefits provided by typical aspects of the invention disclosed in this application are summarized below.

Thus, according to the invention, there can be provided a level conversion circuit in which the variation of output signals from a low level to a high level is substantially equal to that from a high level to a low level, and at the same time it is made possible to increase the operating speed of a system using a semiconductor integrated circuit having a level conversion circuit as its interfacing circuit.

What is claimed is:

1. A level conversion circuit comprising:
a first circuit including a first input terminal for receiving a first signal having a first signal amplitude, a first output terminal for supplying a second signal having a second signal amplitude greater than said first signal amplitude and being in the same phase as said first signal, and a second output terminal for supplying a third signal having said second signal amplitude and being in a phase reverse to said first signal; and
a second circuit including a first p-channel type MOS transistor, a second p-channel type MOS transistor, a first n-channel type MOS transistor, a second n-channel type MOS transistor and, a third output terminal, a source of said first p-channel type MOS transistor being coupled to a first voltage terminal, a drain of said first p-channel type MOS transistor being coupled to a source of said second p-channel type MOS transistor, a drain of said second p-channel type MOS transistor and a drain of said first n-channel type MOS transistor being coupled to said third output terminal, a source of said first n-channel type MOS transistor being coupled to a drain of said second n-channel type MOS transistor and a source of said second n-channel type MOS transistor being coupled to a second voltage terminal,
wherein said second circuit is configured to form a fourth signal outputted from said third output terminal, said fourth signal having a signal level of said second signal amplitude and changing on the basis of the signal variation of said second signal supplied from said first output terminal of said first circuit or of said third signal supplied from said second output terminal of said first circuit whichever signal level changes faster to vary a logical threshold of said second circuit so as to accelerate the variation of said fourth signal.

2. A level conversion circuit according to claim 1, wherein a circuit from which, according to a signal inputted to the gate terminal of a MOS transistor, a signal matching said gate input signal is supplied to the source or drain terminal of the MOS transistor is defined to be one stage, a number of MOS transistor stages gone via by a signal reaching said third output terminal of said second circuit from said first input terminal of said first circuit via said first output terminal is equal to a number of MOS transistor stages gone via by a signal reaching said third output terminal of said second circuit from said first input terminal of said first circuit via said second output terminal,
wherein a stage of said MOS transistor stages is defined as a gate-drain path or a gate-source path of a MOS transistor in the level conversion circuit.

3. A level conversion circuit according to claim 1, wherein the state of said second p-channel type MOS transistor or first n-channel type MOS transistor in said second circuit varies with change in said second signal or third signal supplied from said first circuit.

4. A level conversion circuit according to claim 3, wherein a high resistance element for pull-up use and a high resistance element for pull-down use are connected respectively in parallel to said first p-channel type MOS transistor and said second n-channel type MOS transistor.

5. A level conversion circuit according to claim 4, wherein the ratio between the gate width and the gate length of said first p-channel type MOS transistor is set to be greater than the ratio between the gate width and the gate length of said second p-channel type MOS transistor, and the ratio between the gate width and the gate length of said second n-channel type MOS transistor is set to be greater than the ratio between the gate width and the gate length of said first n-channel type MOS transistor.

6. A level conversion circuit according to claim 1, wherein a high resistance element for pull-up use and a high resistance element for pull-down use are connected respectively in parallel to said first p-channel type MOS transistor and said second n-channel type MOS transistor.

7. A level conversion circuit according to claim 6, wherein the ratio between the gate width and the gate length of said first p-channel type MOS transistor is set to be greater than the ratio between the gate width and the gate length of said second p-channel type MOS transistor, and the ratio between the gate width and the gate length of said second n-channel type MOS transistor is set to be greater than the ratio between the gate width and the gate length of said first n-channel type MOS transistor.

8. A level conversion circuit according to claim 1, wherein the ratio between the gate width and the gate length of said first p-channel type MOS transistor is set to be greater than the ratio between the gate width and the gate length of said second p-channel type MOS transistor, and the ratio between the gate width and the gate length of said second n-channel type MOS transistor is set to be greater than the ratio between the gate width and the gate length of said first n-channel type MOS transistor.

9. A level conversion circuit according to claim 1, wherein said first circuit comprises:

a first inverter for logically inverting said first signal;

a first node for receiving the output signal of said first inverter;

a third n-channel type MOS transistor;

a fourth n-channel type MOS transistor wherein the gate terminals of said third and fourth n-channel type MOS transistors are connected respectively to said first input terminal and said first node;

a third p-channel type MOS transistor whose source-drain path is connected in series to said third n-channel type MOS transistor and whose gate terminal is connected to the drain terminal of said fourth n-channel type MOS transistor; and a fourth p-channel type MOS transistor whose source-drain path is connected in series to said fourth n-channel type MOS transistor and whose gate terminal is connected to the drain terminal of said third n-channel type MOS transistor, said first output terminal being connected to the drain terminal said fourth n-channel type MOS transistor, said second output terminal being connected to the drain terminal of said third n-channel type MOS transistor, and wherein said second circuit comprises a second inverter for logically inverting said third signal being connected to said second output terminal.

10. A level conversion circuit according to claim 9, wherein the state of said second p-channel type MOS transistor or first n-channel type MOS transistor in said second circuit varies with changes in said second signal or the output signal of said second inverter, whichever signal level changes faster.

11. A level conversion circuit according to claim 10, wherein said second circuit further comprises a third inverter to control said first p-channel type MOS transistor and second n-channel type MOS transistor according to the second signal supplied from said first output terminal of said first circuit or the output signal of said second inverter, whichever is slower in signal variation.

12. A level conversion circuit, according to claim 1, wherein the state of said first p-channel type MOS transistor or second n-channel type MOS transistor in said second circuit varies in response to a variation of said second signal or third signal supplied from said first circuit, whichever is faster.

13. A level conversion circuit according to claim 1, wherein said level conversion circuit is included in an input circuit or an output circuit of a semiconductor integrated circuit, and said input or output circuit is connected to an external terminal at which signals of said second amplitude are supplied.

14. A level conversion circuit according to claim 13, wherein said input or output circuit connected to said external terminal includes an inverse level conversion circuit for converting signals of said second amplitude into signals of said first amplitude.

15. A level conversion circuit according to claim 1, wherein the logical threshold of said second circuit is determined by relative gate widths or relative gate width/gate length ratios of MOS transistors in said first and second circuits.

16. A level conversion circuit, comprising:

a first circuit including a first input terminal for receiving a first signal having a first signal amplitude, a first output terminal for supplying a second signal having a second signal amplitude greater than said first signal amplitude and being in the same phase as said first signal, and a second output terminal for supplying a third signal having said second signal amplitude and being in a phase reverse to said first signal; and a second circuit configured to form a fourth signal outputted from a third output terminal, said fourth signal having a signal level of said second signal amplitude and changing on the basis of a variation of said second signal supplied from said first output terminal of said first circuit or of said third signal supplied from said second output terminal of said first circuit, whichever signal level changes faster to vary a logical threshold of said second circuit so as to accelerate the variation of said fourth signal, wherein said second circuit has a first p-channel type MOS transistor, a second p-channel type MOS transistor, a first n-channel type MOS transistor and a second n-channel type MOS transistor whose source-drain paths are connected in series between a first voltage terminal and a second voltage terminal, the drain of said first p-channel type MOS transistor and the drain of said first n-channel type MOS transistor are connected to said third output terminal, high resistance elements are connected respectively in parallel to said second p-channel type MOS transistor and said second n-channel type MOS transistor, and a delay means is provided to delay said second signal supplied from said first output terminal of said first circuit or said third signal supplied from said second output terminal of said first circuit to control said second p-channel type MOS transistor and first n-channel type MOS transistor or said first p-channel type MOS transistor and the second n-channel type MOS transistor.

17. A level conversion circuit according to claim 16, wherein the logical threshold of said second circuit is determined by relative gate widths or relative gate width/gate length ratios of MOS transistors in said first and second circuits.

* * * * *